(12) United States Patent
Sakaue et al.

(10) Patent No.: US 8,814,489 B2
(45) Date of Patent: Aug. 26, 2014

(54) SUBSTRATE PROCESSING SYSTEM AND SUBSTRATE PROCESSING METHOD

(75) Inventors: Hiromitsu Sakaue, Yamanashi (JP); Takashi Horiuchi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 334 days.

(21) Appl. No.: 12/724,763

(22) Filed: Mar. 16, 2010

(65) Prior Publication Data

US 2010/0240200 A1   Sep. 23, 2010

(30) Foreign Application Priority Data

Mar. 17, 2009   (JP) .................................. 2009-064171

(51) Int. Cl.
*H01L 21/677*   (2006.01)

(52) U.S. Cl.
USPC .......................................... 414/217; 414/937

(58) Field of Classification Search
USPC .......................................... 414/217, 411, 937
See application file for complete search history.

(56) References Cited

U.S. PATENT DOCUMENTS

| | | | | |
|---|---|---|---|---|
| 5,174,067 A | * | 12/1992 | Hasegawa et al. | 451/291 |
| 5,183,370 A | * | 2/1993 | Cruz | 414/416.03 |
| 5,451,130 A | * | 9/1995 | Kempf | 414/27 |
| 5,944,940 A | * | 8/1999 | Toshima | 156/345.29 |
| 6,149,367 A | * | 11/2000 | Begin | 414/331.18 |
| 6,234,788 B1 | * | 5/2001 | Lee | 432/124 |
| 6,283,273 B1 | * | 9/2001 | Miyauchi et al. | 198/468.8 |
| 6,746,195 B2 | * | 6/2004 | Shirai | 414/217 |
| 2006/0263176 A1 | * | 11/2006 | Moran | 414/217 |
| 2008/0014057 A1 | * | 1/2008 | Juergensen et al. | 414/217 |

FOREIGN PATENT DOCUMENTS

JP   05-067668 A   3/1993
JP   2007-123592 A   5/2007

* cited by examiner

*Primary Examiner* — Jonathan Snelting
(74) *Attorney, Agent, or Firm* — Pearne & Gordon LLP

(57) ABSTRACT

A substrate processing system includes a processing chamber that performs a preset process on a plurality of substrates in a batch-type manner; a substrate mounting table, installed within the processing chamber, configured to mount the plurality of substrates on a concentric circle and configured to be rotatable forward and backward; substrate accommodation units configured to accommodate the plurality of substrates in multi-stages in a vertical direction; substrate holders and configured to transfer the substrates between the substrate accommodation units and the processing chamber; elevating mechanisms configured to move the substrate accommodation units up and down. Unprocessed substrates are mounted on the substrate mounting table while the substrate mounting table is being rotated in one direction. After the completion of the processing of the substrates, unloading of processed substrates and loading of new unprocessed substrates are performed while the substrate mounting table is rotated in the another direction.

6 Claims, 22 Drawing Sheets

SUBSTRATE PROCESSING SYSTEM AND SUBSTRATE PROCESSING METHOD

FIELD OF THE INVENTION

The present disclosure relates to a substrate processing system and a substrate processing method for performing a preset process on a plurality of substrates in a batch-type manner.

BACKGROUND OF THE INVENTION

For example, in a manufacturing process of a semiconductor device, various processes such as an ion implanting process, an etching process, and a film forming process are performed on a substrate. In a batch-type processing apparatus such as an ion implanting apparatus that processes a plurality of substrates in a processing chamber, it is desirable to perform the unloading of a processed substrate from the processing chamber and the loading of a unprocessed substrate into the processing chamber at the same time, thus allowing the replacement of the processed substrate with the unprocessed substrate to be carried out in a short period of time. It is because the processing apparatus enters a standby mode and stops operation when the replacement of the processed substrate and the unprocessed substrate is performed, thus causing deterioration of a throughput of the processing apparatus.

In this regard, as disclosed in, for example, Patent Document 1, there has been conventionally proposed a substrate transfer apparatus in which substrate accommodation unit for storing therein substrates in multi-stages and transfer arms for transferring a substrate between the substrate accommodation unit and the processing chamber are independently installed for loading and unloading of the substrates into and out of the processing chamber.

In using the substrate transfer apparatus disclosed in, for example, Patent Document 1, the substrate processing apparatus still enters the standby mode, for example, when unprocessed substrates in another substrate accommodation vessel installed outside the system are transferred into the substrate accommodation unit by another transfer arm after all the substrates in the substrate accommodation unit are loaded into the processing chamber. In this regard, Patent Document 2, for example, discloses a transfer arm having a plurality of substrate holders in multi-stages as a means for transferring of the substrates between a multi-stage substrate accommodation unit and another transfer arm.

Patent Document 1: Japanese Patent Laid-open Publication No. H5-67668
Patent Document 2: Japanese Patent Laid-open Publication No. 2007-123592

BRIEF SUMMARY OF THE INVENTION

However, even if the transfer of the substrates between the substrate accommodation unit and another transfer arm is carried out efficiently, a final throughput of the processing apparatus is determined depending on the time required for the replacement of the processed substrate with the unprocessed substrate within the processing apparatus. Further, the transfer arm disclosed in, e.g., Patent Document 1 takes various motions such as an elevating motion for accessing an accommodation height of each substrate within the substrate accommodation unit, a translating motion for approaching an accommodation position of each substrate within the substrate accommodation unit after the elevating motion, a substrate transferring motion for transferring the substrate to/from the substrate accommodation unit by being moved up and down below the substrate, and so forth when it transfers the substrate to/from the substrate accommodation units. Therefore, it has been difficult to reduce the operation time of the transfer arm. Thus, the present inventors have conducted various researches to reduce the time required for the replacement of the substrates within the processing chamber and conceived a transfer arm as described below, for example.

As illustrated in FIGS. 24 and 25, a transfer apparatus 100 includes, for example, a substrate accommodation unit 102 configured to accommodate substrates W to be loaded into a processing apparatus 101, which performs batch processing on the substrates W, in multi-stages; a substrate accommodation unit 103 configured to accommodate processed substrates Wa, which are unloaded from the processing apparatus 101, in multi-stages; a substrate holder 104 configured to hold the substrates W of the substrate accommodation unit 102 so as to load them into the processing chamber 101; a substrate holder 105 configured to hold the substrates Wa of the processing apparatus 101 so as to unload them from the substrate accommodation unit 103 and accommodate the unloaded substrates Wa in the substrate accommodation unit 103. The substrate accommodation units 102 and 103 are configured to be vertically movable. The substrate holders 104 and 105 and supports 110 installed within the substrate accommodation units 102 and 103 so as to support the substrates are configured such that the substrate holders 104 and 105 and supports 110 can pass each other without interference.

In the transfer apparatus 100 as described above, the substrate holder 104 is first set in a standby position below the substrate accommodation unit 102, for example. In this state, the substrate accommodation unit 102 is lowered, whereby a substrate held by the supports 110 is transferred onto the substrate holder 104 when the supports 110 and the substrate holder 104 pass each other, as illustrated in FIG. 25. The transfer of the substrate between the supports 110 and the substrate holder 104 is carried out by moving the substrate holder 104 to a transfer position of the substrate after mounting the substrate held by the substrate holder 104 onto a rotary table 111 within the processing apparatus 101 and then lowering the substrate accommodation unit 102 again by a distance which is an interval between the supports 110. Accordingly, when the substrate is transferred between the supports 110 and the substrate holder 104, the conventionally performed elevating motion for elevating the substrate holder 104 so as to allow it to access the accommodation height of each substrate in the substrate accommodation unit 102, the translating motion for horizontally moving the substrate holder toward the substrate accommodation position within the substrate accommodation unit 102 after the elevating motion, and the substrate transferring motion for elevating the substrate holder 104 from below the substrate to thereby allow the substrate to be transferred from/to the substrate accommodation unit become unnecessary. Further, by applying this transfer method to the substrate accommodation unit 103 and the substrate holder 105 in a reverse sequence to the above-described sequence, the transfer method can also be used to unload a processed substrate from the processing apparatus 101. Thus, the time for the replacement of the substrates W and Wa between the processing apparatus 101 and the substrate accommodation units 102 and 103 can be shortened, so that the throughput of the processing apparatus 101 can be further improved.

When, however, the transfer arm having the plurality of multi-stage substrate holders is used between the substrate accommodation units 102 and 103 provided in the transfer apparatus 100 and the substrate accommodation vessel installed outside a system, as disclosed in the above-mentioned Patent Document 2, it involves a new problem.

The new problem is described in the following. When the loading/unloading of the substrate into/from the processing apparatus 101 is performed by using the transfer apparatus 100, the substrates W are accommodated from outside a system into the substrate accommodation unit 102 in the order of the substrate W1 from the bottom. Then, when they are unloaded from the processing apparatus 1 after their processing has been completed in the processing apparatus 101, the substrates W are accommodated in the substrate accommodation unit 103 by the substrate holder 101 in the order of the substrate W1 from the top. That is, the positions of the substrates W are reversed to their original positions. This reversal of the substrate positions is caused because the transfer of the substrates onto the substrate holder 14 is performed in the order of W1 from the bottom by lowering the substrate accommodation unit 102 when the substrates are unloaded from the substrate accommodation unit 102, whereas the accommodation of the processed substrates in the substrate accommodation unit 103 is performed in the order of Wa1 from the top.

If the transfer arm having the plurality of multi-stage substrate holders is used when the order of the substrates is reversed, the order of the substrates remains reversed when they are accommodated in the substrate accommodation vessel outside the system, thus causing problems in post processes.

In view of the foregoing, the present disclosure is capable of transferring substrates between a processing apparatus and a substrate accommodation unit in a shorter period of time as compared to conventional cases, while maintaining the original order of the processed substrate to be accommodated in the substrate accommodation unit.

In accordance with one aspect of the present disclosure, there is provided a substrate processing system including: a processing chamber that performs a preset process on a plurality of substrates in a batch-type manner; a substrate mounting table, installed within the processing chamber, configured to mount the plurality of substrates on a concentric circle and to be rotatable forward and backward; a first substrate accommodation unit configured to accommodate the plurality of substrates in multi-stages in a vertical direction; a second substrate accommodation unit configured to accommodate the plurality of substrates in multi-stages in a vertical direction; a first substrate holder configured to hold the substrate transferred between the first substrate accommodation unit and the processing chamber; a second substrate holder configured to hold the substrate transferred between the second substrate accommodation unit and the processing chamber; a first elevating mechanism configured to transfer the substrate between the first substrate accommodation unit and the first substrate holder by way of moving at least one of the first substrate accommodation unit and the first substrate holder up and down relative to each other; a second elevating mechanism configured to transfer the substrate between the second substrate accommodation unit and the second substrate holder by way of moving at least one of the second substrate accommodation unit and the second substrate holder up and down relative to each other; and a controller that controls a rotation of the substrate mounting table, an up/down movement of the first and second elevating mechanisms and the transfer of the substrates by the first and second substrate holders. The controller performs: a control so as to transfer unprocessed substrates from the first substrate accommodation unit to the first substrate holder by way of lowering the first substrate accommodation unit for accommodating the unprocessed substrates relative to the first substrate holder, and load the unprocessed substrates into the processing chamber in sequence by the first substrate holder while sequentially rotating the substrate mounting table at a preset angle in one direction; a control so as to perform the preset process on the plurality of substrates within the processing chamber; and a control so as to unload processed substrates from the processing chamber by the first substrate holder after the completion of the preset process; transfer the processed substrates into the first substrate accommodation unit from the first substrate holder by way of raising the first substrate accommodation unit relative to the first substrate holder; transfer unprocessed substrates from the second substrate accommodation unit onto the second substrate holder by way of lowering the second substrate accommodation unit for accommodating the unprocessed substrates relative to the second substrate holder and load the unprocessed substrate into the processing chamber in sequence by the second substrate holder while sequentially rotating the substrate mounting table at the preset angle in the another direction. Here, the meaning of the expression of "moving at least one of the first substrate accommodation unit and the first substrate holder up and down relative to each other" implies, for example, moving the substrate up and down while the position of the substrate holder is fixed or moving the substrate holder up and down while the position of the substrate is fixed, and it may also imply moving both the substrate holder and the substrate up and down.

In accordance with the present disclosure, the substrate mounting table that mounts the plurality of substrates on a concentric circle is configured to be rotatable forward and backward. Thus, after the process of the substrate is performed in the processing chamber, by unloading the processed substrates from the processing chamber with the substrate holder used to load the unprocessed substrates into the processing chamber while rotating the substrate mounting table in a reverse direction to a rotation direction in which the unprocessed substrates are loaded into the processing chamber, the lastly loaded substrate can be unloaded first. In this way, by accommodating the processed substrates in the substrate accommodation unit, which is in a standby mode after the loading of the unprocessed substrates is completed, in sequence from the lastly loaded substrate, the transfer of the substrates between the processing apparatus and the substrate accommodation unit can be carried out in a shorter period of time as compared to conventional cases, while maintaining the original order of the processed substrate.

The substrate processing system may further include a substrate transfer device configured to transfer the substrates between a substrate accommodation vessel and the first and second substrate accommodation units. The substrate transfer device may include substrate holding members in multi-stages in a vertical direction so as to hold the substrates.

In the first substrate accommodation unit, a support configured to support a the substrate may be provided at a position where the support is not overlapped with the first substrate holder when viewed from the top, and in the second substrate accommodation unit, a support configured to support a the substrate may be installed at a position where the support is not overlapped with the second substrate holder when viewed from the top.

The first elevating mechanism may move the first substrate accommodation unit up and down, and the second elevating mechanism may move the second substrate accommodation unit up and down. The first substrate accommodation unit may include a first support moving mechanism that moves the support between the inside and the outside of the substrate. The second substrate accommodation unit may include a second support moving mechanism that moves the support between the inside and the outside of the substrate. The first elevating mechanism may move the first substrate holder up and down, and the second elevating mechanism may move the second substrate holder up and down.

The substrate processing system may further include a first supporting pin configured to support the substrate in the first substrate accommodation unit; and a second supporting pin configured to support the substrate in the second substrate accommodation unit. The first substrate accommodation unit may include a first support moving mechanism that moves the support between the inside and the outside of the substrate. The second substrate accommodation unit may include a second support moving mechanism that moves the support between the inside and the outside of the substrate. The first elevating mechanism may move the first substrate holder up and down, and the second elevating mechanism may move the second substrate holder up and down.

In accordance with another aspect of the present disclosure, there is provided a substrate processing method using a substrate processing apparatus including a processing chamber that performs a preset process on a plurality of substrates; a substrate mounting table, installed within the processing chamber, configured to mount the plurality of substrates on a concentric circle and to be rotatable forward and backward; a first substrate accommodation unit configured to accommodate the plurality of substrates in multi-stages in a vertical direction; a second substrate accommodation unit configured to accommodate the plurality of substrates in multi-stages in a vertical direction; a first substrate holder configured to transfer the substrate between the first substrate accommodation unit and the processing chamber; a second substrate holder configured to transfer the substrate between the second substrate accommodation unit and the processing chamber; a first elevating mechanism configured to move at least one of the first substrate accommodation unit and the first substrate holder up and down relative to each other; and a second elevating mechanism configured to move at least one of the second substrate accommodation unit and the second substrate holder up and down relative to each other. The substrate processing method includes: transferring unprocessed substrates from the first substrate accommodation unit to the first substrate holder by way of lowering the first substrate accommodation unit for accommodating the unprocessed substrates relative to the first substrate holder, and loading the unprocessed substrates into the processing chamber in sequence by the first substrate holder while sequentially rotating the substrate mounting table at a preset angle in one direction; performing the preset process on the plurality of substrates in a batch-type manner within the processing chamber; and unloading processed substrates from the processing chamber by the first substrate holder after the completion of the preset process, transferring the processed substrates into the first substrate accommodation unit from the first substrate holder by way of raising the first substrate accommodation unit relative to the processed substrate of the first substrate holder, transferring unprocessed substrates from the second substrate accommodation unit to the second substrate holder by way of lowering the second substrate accommodation unit relative to the second substrate holder and loading the unprocessed substrate into the processing chamber in sequence by the second substrate holder while sequentially rotating the substrate mounting table at the preset angle in the another direction.

Inside the first substrate accommodation unit, a support configured to support the substrate may be installed at a position where the support is not overlapped with the first substrate holder when viewed from the top. Inside the second substrate accommodation unit, a support configured to support the substrate may be installed at a position where the support is not overlapped with the second substrate holder when viewed from the top. The relative up/down movement of the first substrate accommodation unit and the first substrate holder may be carried out by moving the first substrate accommodation unit up and down, and the relative up/down movement of the second substrate accommodation unit and the second substrate holder may be carried out by moving the second substrate accommodation unit up and down.

The first substrate accommodation unit may include a first support moving mechanism that moves the support between the inside and the outside of the substrate. The second substrate accommodation unit may include a second support moving mechanism that moves the support between the inside and the outside of the substrate. The support configured to support the substrate may be installed inside the first substrate accommodation unit at a position where the support is not overlapped with the first substrate holder when viewed from the top. The support configured to support the substrate may be installed inside the second substrate accommodation unit at a position where the support is not overlapped with the second substrate holder when viewed from the top. The relative up/down movement of the first substrate accommodation unit and the first substrate holder may be carried out by moving the first substrate holder up and down. The relative up/down movement of the second substrate accommodation unit and the second substrate holder may be carried out by moving the second substrate holder up and down. The support may be retreated to a position where the support is not overlapped with the substrate, when viewed from the top, when the support does not support the substrate, and the support may be moved to a position where the support supports the substrate when the substrate is moved from below the support to above the support.

The substrate processing method may further include: a first supporting pin configured to support the substrate in the first substrate accommodation unit; and a second supporting pin configured to support the substrate in the second substrate accommodation unit. The first substrate accommodation unit may include a first support moving mechanism that moves the support between the inside and the outside of the substrate. The second substrate accommodation unit may include a second support moving mechanism that moves the support between the inside and the outside of the substrate. Inside the first substrate accommodation unit, the support configured to support the substrate may be installed at a position where it is not overlapped with the first substrate holder when viewed from the top. Inside the second substrate accommodation unit, the support configured to support the substrate thereon may be installed at a position where it is not overlapped with the second substrate holder when viewed from the top. The relative up/down movement of the first substrate accommodation unit and the first substrate holder may be carried out by moving the first supporting pin up and down. The relative up/down movement of the second substrate accommodation unit and the second substrate holder may be carried out by moving the second supporting pin up and down. The support may be retreated to a position where the support is not overlapped with the substrate, when viewed from the top, when the support does not support the substrate, and the support may be moved to a position where it supports the substrate when the substrate is moved from below the support to above the support.

In accordance with still another aspect of the present disclosure, there is provided a substrate processing method using a substrate processing apparatus including a processing chamber that performs a preset process on a plurality of substrates in a batch-type manner; a substrate mounting table, installed within the processing chamber, configured to mount the plurality of substrates on a concentric circle and to be rotatable forward and backward; a first substrate accommodation unit configured to accommodate the plurality of substrates in multi-levels in a vertical direction; a second substrate accommodation unit configured to accommodate the plurality of substrates in multi-levels in a vertical direction; a first substrate holder configured to transfer the substrate between the substrate mounting table and the first substrate accommodation unit; and a second substrate holder configured to transfer the substrate between the substrate mounting table and the second substrate accommodation unit. The substrate processing method includes: accommodating a plurality of unprocessed substrates in the first substrate accommodation unit; transferring a single sheet of processed substrate from the substrate mounting table to the second substrate holder and accommodating the processed substrate in the second substrate accommodation unit; performing, plural times, operations including: transferring the unprocessed substrate from the first substrate accommodating unit onto the first substrate holder and transferring the processed substrate from the second substrate holder into the second substrate accommodation unit, transferring the unprocessed substrate, which is delivered to the first substrate holder, onto the substrate mounting table, mounting the unprocessed substrate, which is transferred onto the substrate mounting table, on the substrate mounting table and receiving the processed substrate mounted on the substrate mounting table by the second substrate holder, transferring the processed substrate, which is received from the substrate mounting table, into the second substrate accommodation unit, and rotating the substrate mounting table at a preset angle in one direction; transferring the unprocessed substrate from the first substrate accommodation unit to the first substrate holder and mounting the unprocessed substrate on the substrate mounting table; performing the preset process on the plurality of substrates within the processing chamber in a batch-type manner; unloading the processed substrate from the second substrate accommodation and accommodating a plurality of unprocessed substrates in the second substrate accommodation unit; transferring a single sheet of processed substrate from the substrate mounting table to the first substrate holder and accommodating the processed substrate in the second substrate accommodation unit; performing, plural times, operations including: transferring the unprocessed substrate from the second substrate accommodating unit to the second substrate holder and transferring the processed substrate from the first substrate holder into the second substrate accommodation unit; transferring the unprocessed substrate, which is delivered to the second substrate holder, onto the substrate mounting table; mounting the unprocessed substrate, which is transferred onto the substrate mounting table, on the substrate mounting table and receiving the processed substrate mounted on the substrate mounting table by the first substrate holder; transferring the processed substrate, which is received from the substrate mounting table, into the first substrate accommodation unit; and rotating the substrate mounting table at a preset angle in the another direction.

In accordance with the present disclosure, the transfer of the substrates can be carried out between the processing apparatus and the substrate accommodation unit in a shorter period of time as compared to conventional cases, while maintaining the original order of the processed substrates to be accommodated in the substrate accommodation unit.

BRIEF DESCRIPTION OF THE DRAWINGS

The disclosure may best be understood by reference to the following description taken in conjunction with the following figures.

DETAILED DESCRIPTION OF THE INVENTION

Figure 1:
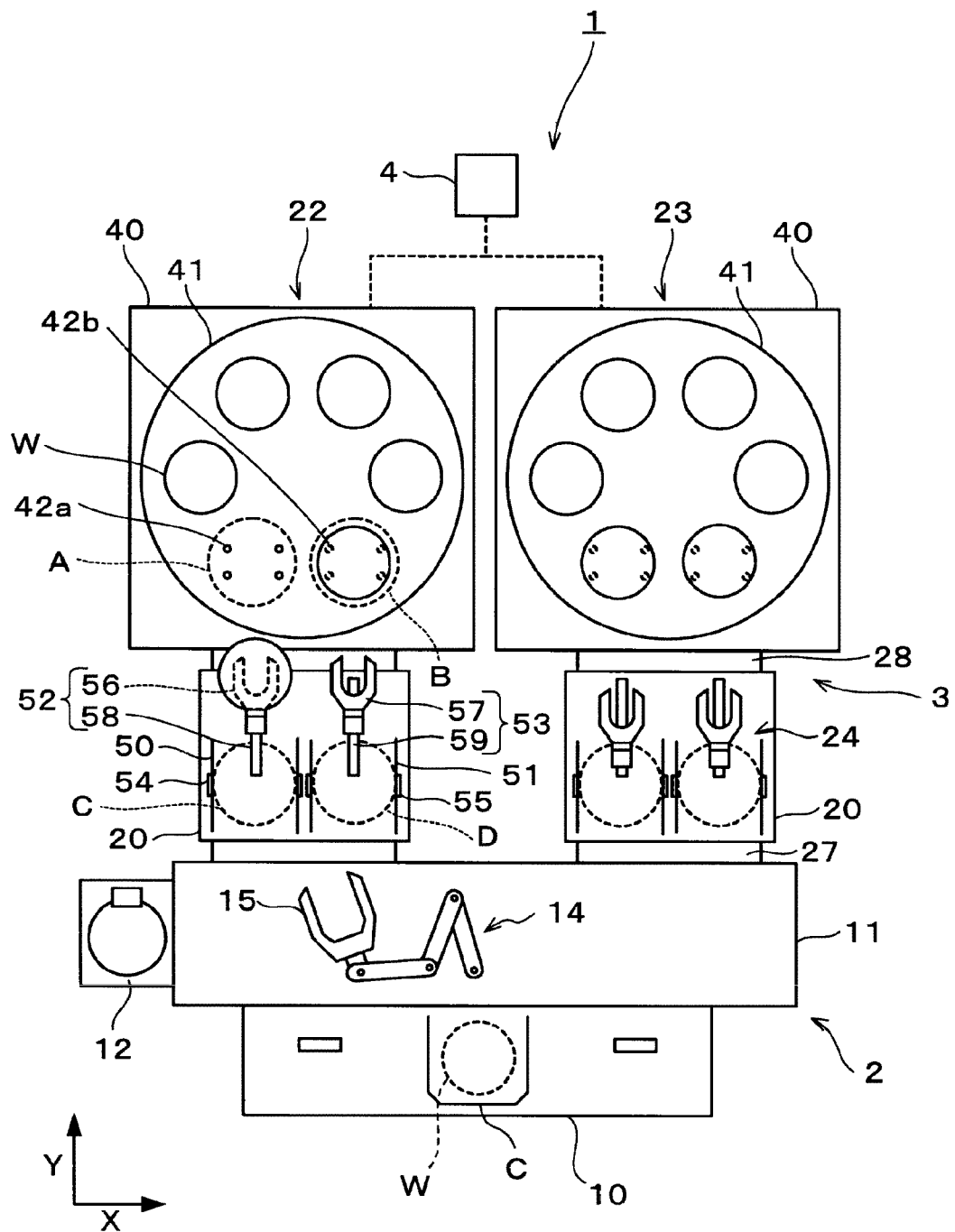
FIG. 1 is a plane view showing a schematic configuration of a substrate processing system in accordance with an embodiment of the present disclosure.

Hereinafter, embodiments of the present disclosure will be described. FIG. 1 is a plane view showing a schematic configuration of a substrate processing system 1 in accordance with the present embodiment. Further, a semiconductor wafer, for example, is used as a substrate W of the present embodiment.

The substrate processing system 1 includes, as illustrated in FIG. 1, a cassette station 2 where a plurality of substrates W are loaded and unloaded as a cassette unit; a processing station 3 including a plurality of processing apparatuses that perform, e.g., a batch processing on the plurality of substrates W; and a controller 4 that controls the processing of the substrates W in the processing station 3. The cassette station 2 and the processing station 3 are connected as one body.

Figure 2:
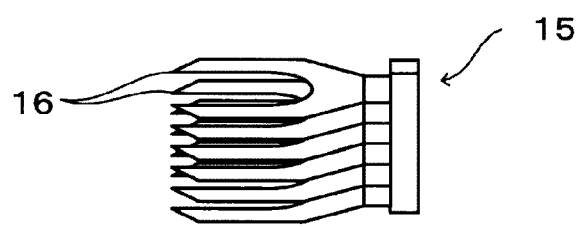
FIG. 2 is a diagram showing a schematic configuration of an arm having substrate holders in multi-stages.

The cassette station 2 includes a cassette mounting unit 10, a transfer chamber 11 arranged adjacent to the cassette mounting unit 10. The cassette mounting unit 10 is configured to mount a plurality of, e.g., three, cassettes C, each capable of storing a plurality of substrates W as a substrate receiving vessel, in parallel in an X-axis direction (right and left directions in FIG. 1). Installed in the transfer chamber 11 is a substrate transfer device 14. The substrate transfer device 14 has a multi-joint arm 15 capable of revolution, expansion and contraction, and elevation and is configured to transfer the substrate W to the cassette C in the cassette mounting unit 10 and to substrate accommodation units 50 and 51, which will be described later, installed in the processing station 3. The arm 15 includes, as illustrated in FIG. 2, substrate holders 16 configured to hold the substrates. The multi-stage substrate holders 16 are arranged in a vertical direction, so that the plurality of substrates W can be held by them at the same time.

The processing station 3 includes two load lock chambers 20 serving as transfer chambers capable of being depressurized inside; processing apparatuses 22 and 23 for performing a batch process on the plurality of substrates W; and a substrate transfer apparatus 24 for transferring a substrate between the load lock chamber 20 and each of the processing apparatuses 22 and 23. The load lock chamber 20 is positioned between the transfer chamber 11 and each of the processing apparatuses 22 and 23 and connects the transfer chamber 11 with each of the processing apparatuses 22 and 23. The substrate transfer apparatus 24 is positioned inside the load lock chamber 20.

Figure 3:
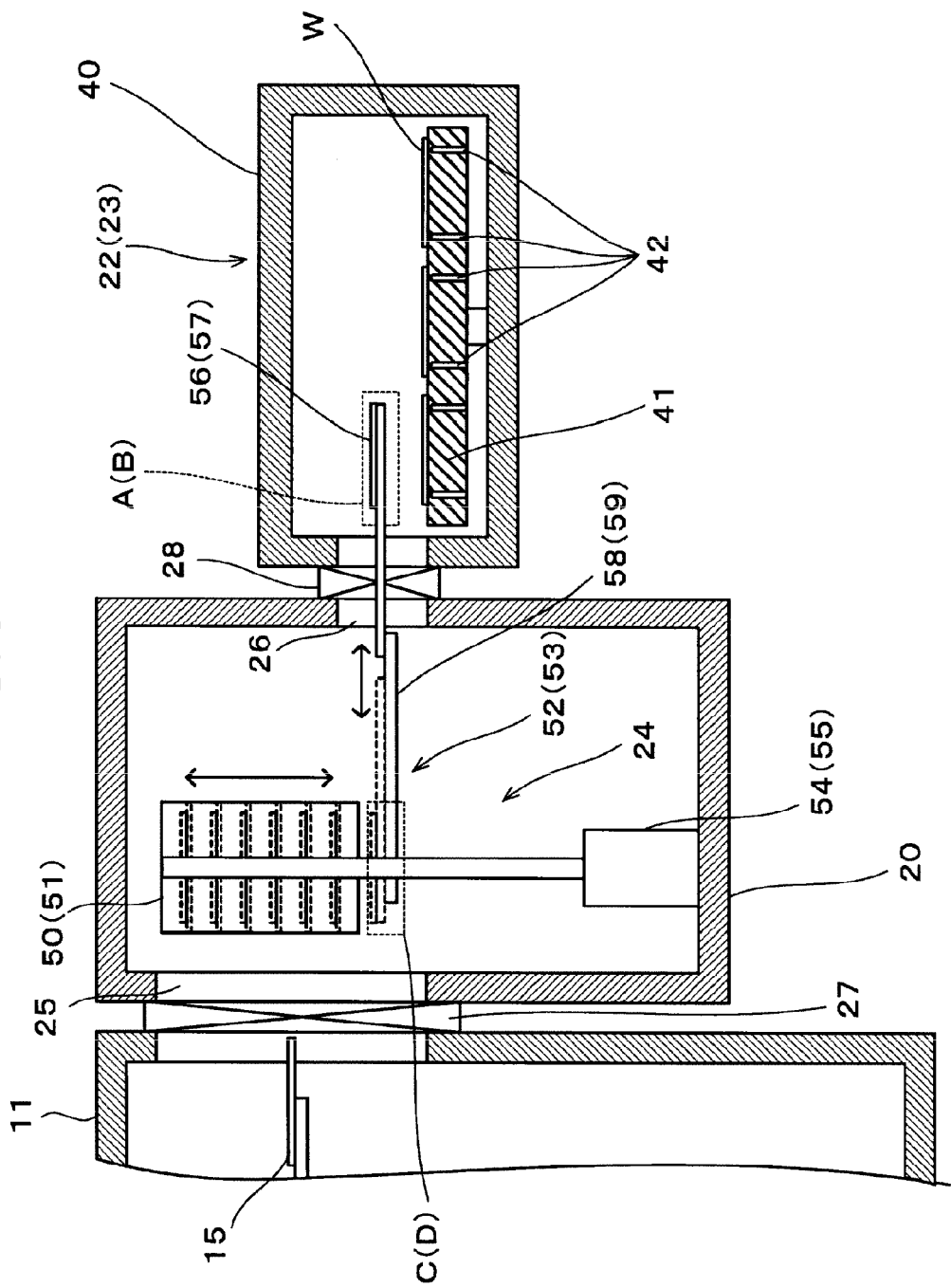
FIG. 3 is a longitudinal cross sectional view showing a schematic configuration of a substrate transfer apparatus and a processing apparatus.

As illustrated in FIG. 3, provided at both sides of the load lock chamber 20 are an opening 25 through which the substrate W is transferred into the load lock chamber 20 by the arm 15, and an opening 26 through which the substrate W is transferred between the load lock chamber 20 and the processing chamber 22 (23) by the substrate transfer apparatus 24. Installed at a position corresponding to the opening 25 between the transfer chamber 11 and the load lock chamber 20, and at a position corresponding to the opening between the load lock chamber 20 and the processing chamber 22 (23) are gate valves 27 and 28, respectively, which provide an airtight seal therebetween and are configured to be openable/closable.

The processing apparatus 22 includes a processing chamber 40 having an opening at a position corresponding to the opening 26 and capable of being depressurized inside; and a substrate mounting table 41 having, e.g., a disk shape and installed inside the processing chamber 40 so as to mount a plurality of substrates W on a concentric circle. The substrate mounting table 41 is configured such that it is rotatable forward and backward, i.e., rotatable in both clockwise direction and counterclockwise direction when viewed from the top. The substrate mounting table 41 is controlled by the controller 4. Further, in the present embodiment, the substrate mounting table 41 is configured to mount, e.g., 6 substrates W.

Installed below a position where the substrate W is mounted on the substrate mounting table 41 are elevating pins 42 serving as a supporting member for supporting and elevating the substrate W from the bottom. As illustrated in FIG. 3, the elevating pins 42 penetrate the substrate mounting table 41 in its thickness direction and can be moved vertically by an elevation driving mechanism (not illustrated). In a case where the substrate W is transferred, the elevating pins 42 are elevated up to a transfer position A (B), where the substrate W is received from the substrate holders 56 and 57, which will be described later, above the substrate mounting table 41, whereas in the other cases, the elevating pins 42 are sunk into the substrate mounting table 41. Further, the batch processing performed in the processing chamber 40 is, for example, a film forming process in the present embodiment.

The substrate transfer apparatus 24 includes substrate accommodation units 50 and 51 that first accommodate the substrates W transferred between the transfer chamber 11 and the processing apparatus 22; transfer mechanisms 52 and 53 that transfer the substrate W between the substrate accommodation units 50 and 51 and the processing apparatus 22; and elevating mechanisms 54 and 55 that elevate the substrate accommodation units 50 and 51 in a vertical direction. The substrate accommodation units 50 and 51 are arranged in parallel in the X-axis direction, for example, in FIG. 1, and the transfer mechanisms 52 and 53 are positioned between the processing apparatus 22 and the substrate accommodation units 50 and 51, respectively. The elevating mechanisms 54 and 55 and the transfer mechanisms 52 and 53 are controlled by the controller 4.

The transfer mechanisms 52 and 53 include the U-shaped, for example, substrate holders 56 and 57 for holding the substrate W when transferring the substrate W and moving mechanisms 58 and 59 for moving the substrate holders 56 and 57, respectively. The substrate holders 56 and 57 are configured to be moved by the moving mechanisms 58 and 59 between above the elevating pins 42 of the substrate mounting table 41 (transfer positions A and B) and below a substrate mounted within the substrate accommodation units 50 and 51 (standby positions C and D). Further, the moving mechanisms 58 and 59 desirably move the substrate holders 56 and 57 in a straight line so as to reduce a moving time of the substrate holders 56 and 57 between the transfer positions A and B and the standby positions C and D, and in the present embodiment, the moving mechanisms 58 and 59 are transfer rails each including, e.g., a non-illustrated driving mechanism.

Figure 4:
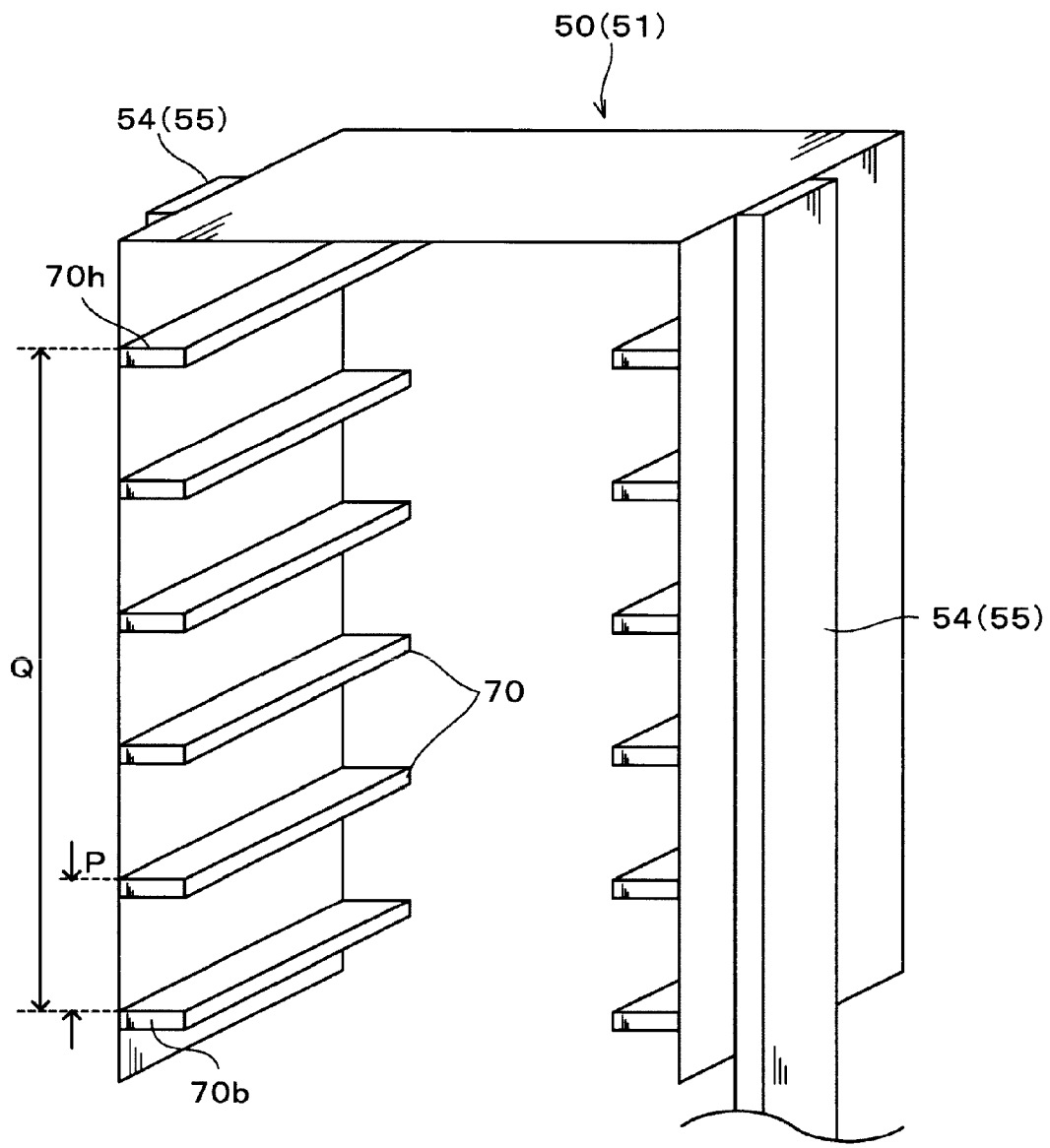
FIG. 4 sets forth a diagram showing a schematic configuration of a substrate accommodation unit.
Figure 5:
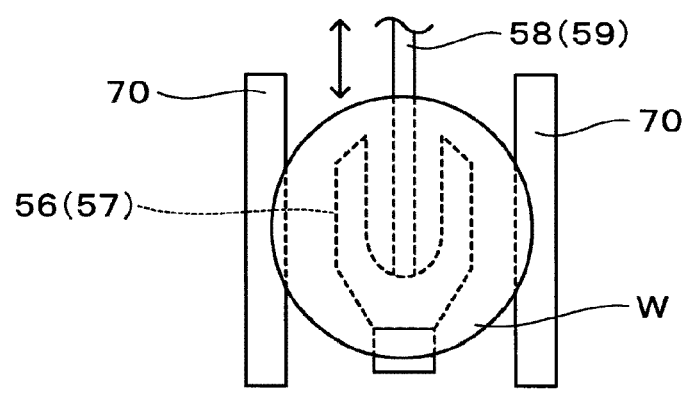
FIG. 5 sets forth a diagram showing a positional relationship between supports and a substrate holder.

The substrate accommodation units 50 and 51 are formed into a substantially rectangular column shape with, e.g., open side surfaces facing the transfer chamber 11 and the processing apparatus 22, respectively and an open bottom surface as illustrated in FIG. 4. At the closed side surfaces of the substrate accommodation units 50 and 51, flat plate-shaped supports 70 for supporting the substrate W are installed in a vertical direction, for example, in a multi-stage at a predetermined, equal distance P and these supports 70 are configured to receive the plurality of substrates W. The supports 70 are positioned not to be overlapped with the substrate holders 56 and 57 when viewed from the top as illustrated in FIG. 5, for example, such that when the substrate accommodation units 50 and 51 are elevated by the elevating mechanisms 54 and 55, the supports 70 do not interfere with the substrate holders 56 and 57, respectively. The elevating mechanisms 54 and 55 are configured such that when the substrate accommodation units 50 and 51 are elevated, a lower end support 70b can be raised to a position (hereinafter, referred to as "raised position") above the substrate holders 56 and 57 of the transfer mechanisms 52 and 53 and an upper end support 70h can be lowered to a position (hereinafter, referred to as "lowered position") below the substrate holders 56 and 57 of the transfer mechanisms 52 and 53. That is, the elevating mechanisms 54 and 55 are configured to elevate the substrate accommodation units 50 and 51 through at least a distance Q between the upper end support 70h and the lower end support 70b of the substrate accommodation units 50 and 51. Further, in FIG. 4, although the substrate accommodation units 50 and are configured to have multi-stage shelves capable of concurrently accommodating, e.g., 6 substrates, corresponding to the number of the substrates on which a batch processing can be performed in the processing apparatus 22, the number of the supports 70 is not limited to the example shown in FIG. 4 but can be varied as required. Furthermore, the shape of the supports 70 can also be varied and modified as long as they are capable of supporting the substrates W while not overlapped with the substrate holders 56 and 57 when viewed from the top.

Since the configuration of the processing apparatus 23 is the same as that of the above-described processing apparatus 22, redundant descriptions thereof will be omitted herein. The processing apparatuses 22 and 23 are not limited to the film forming apparatus and can be, for example, a coating apparatus, an etching apparatus, a plasma apparatus or the like. Further, the processing apparatus 22 and the processing apparatus 23 may be different apparatuses from each other.

The substrate processing system 1 in accordance with the present embodiment is configured as described above. Now, an operation of the substrate processing system 1 will be explained.

When processing of substrates W is performed, a plurality of unprocessed substrates W is taken out of the cassette C of the cassette station 2 by the arm 15 of the substrate transfer device 14 and then accommodated in the substrate accommodation units 50 and 51 in the load lock chamber 20 in the same order as they are accommodated in the cassette C.

When the substrates W are completely accommodated in the substrate accommodation unit 50, the substrate transfer device 14 is moved out of the load lock chamber 20, and the gate valve 27 installed at the atmospheric atmosphere side of the load lock chamber 20, i.e., at the transfer chamber side is closed. Thereafter, the inside of the load lock chamber 20 is evacuated and depressurized to a predetermined pressure level.

Subsequently, by opening the gate valve 28 installed between the load lock chamber 20 and the processing chamber 40, the inside of which is maintained in a vacuum state, the substrate W in the substrate accommodation unit 50 is loaded into the processing chamber 40 by the transfer mechanism 52.

Figure 6:
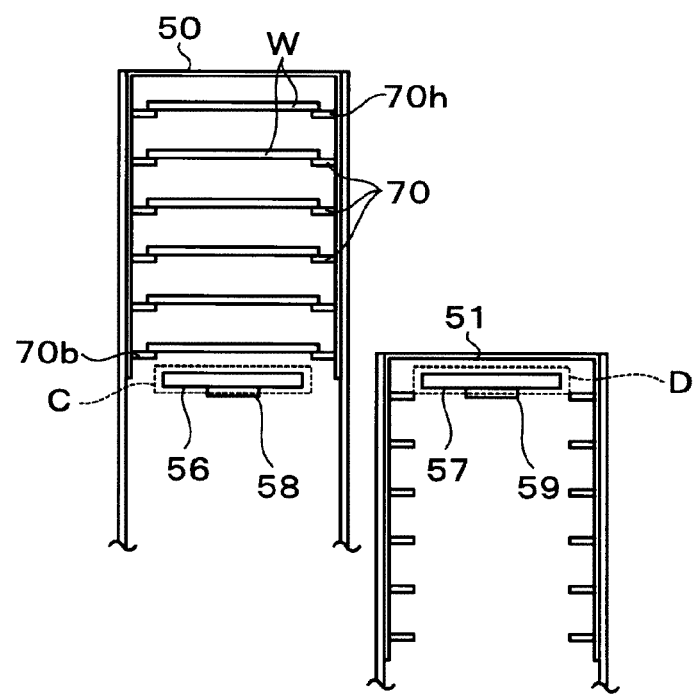
FIG. 6 is a diagram showing states where the substrate holder is moved to a raised position and a lowered position, respectively.
Figure 7:
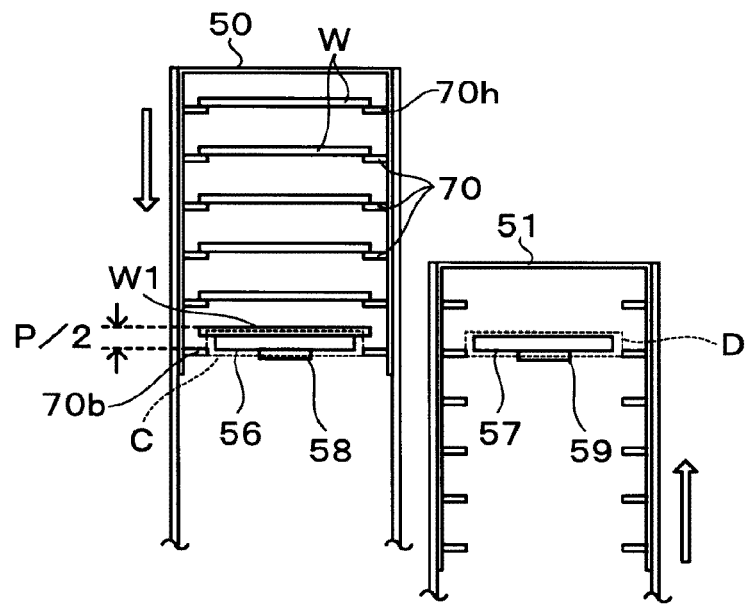
FIG. 7 provides a diagram showing a state where a substrate is transferred onto the substrate holder.

An operation of loading the substrate W into the processing chamber 40 will be explained in detail. When the substrate W is loaded into the processing chamber 40, the substrate accommodation unit 50 is first raised to the raised position by the elevating mechanism 54. At the same time, the substrate accommodation unit 51 is lowered to the lowered position by the elevating mechanism 55 (see FIG. 6). Then, the substrate holders 56 and 57 are moved to the standby positions C and D, respectively. Thereafter, the substrate accommodation unit 50 is lowered near a position where a bottom surface of a substrate W1 mounted on the support 70b is in direct contact with a top surface of the substrate holder 56. Then, from here, the substrate accommodation unit 50 is further lowered by a shorter distance than a distance P between the adjacent supports 70, e.g., about a half of the distance P. At the same time, the substrate accommodation unit 51 is raised up by the same distance as the substrate accommodation unit 50 is lowered (see FIG. 7). At this time, the supports 70 are positioned at the position where it is not overlapped with the substrate holder 56 when viewed from the top, so that by lowering the substrate accommodation unit 50 by about a half of the distance P, the supports 70 do not interfere with the substrate holder 56 and can be in vertically alternate positions. Further, while they pass each other, the substrate W1 mounted on the support 70b is transferred to the substrate holder 56. Further, the substrate mounting table 41 is rotated at a preset angle α in, e.g., clockwise direction by the controller 4 which has detected the transfer of the substrate W1 to a substrate holder 56 and the transfer of the unprocessed substrates W to the substrate holder 56. Here, the angle α is obtained by dividing a revolution angle (2π) of the substrate mounting table 41 by the number n of the substrates W to be mounted on the substrate mounting table 41. In addition, if the unprocessed substrate W is transferred onto the substrate holder 56 when a substrate is not yet mounted on the substrate mounting table 41, as in the case of the first substrate loading, the substrate mounting table 41 need not be rotated.

Figure 8:
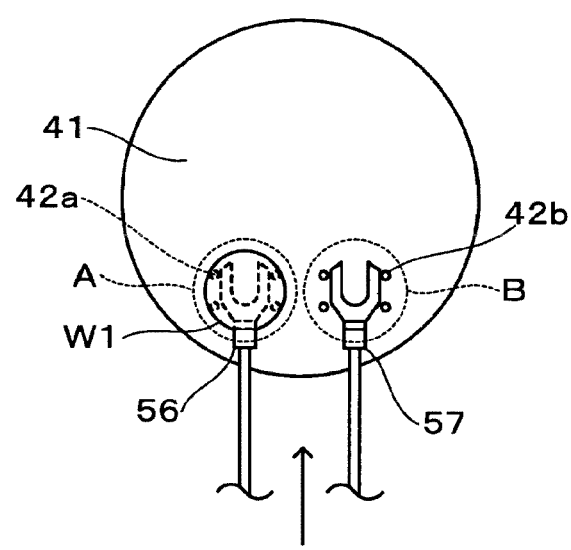
FIG. 8 is a diagram showing a state where the substrate holder is moved to a transfer position.
Figure 9:
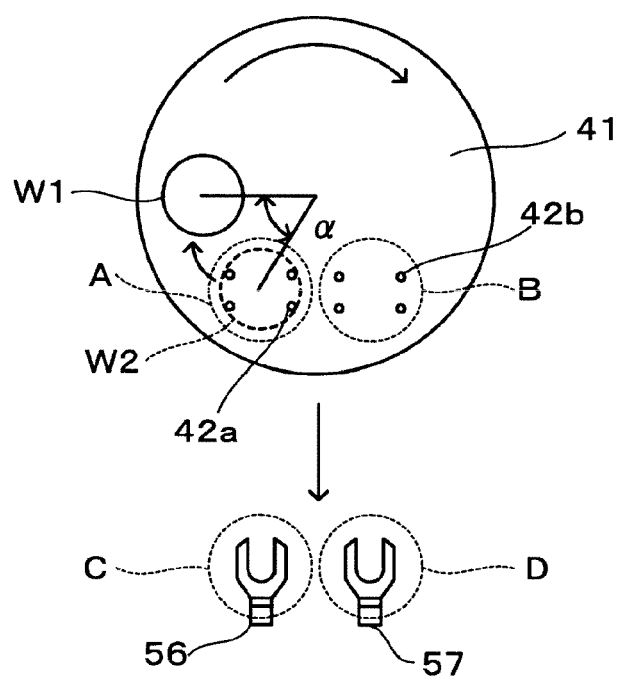
FIG. 9 is a diagram showing a state where a substrate mounting table is rotated at a preset angle after a substrate is mounted on the substrate mounting table.

The substrate holder 56 which holds the substrate W1 and the substrate holder 57 which does not hold the substrate W are introduced into the processing chamber 40 from the load lock chamber 20 by the transfer mechanism 52 via the opening 26, and both are on standby at the transfer positions A and B, i.e., above elevating pins 42a and 42b (see FIG. 8). Subsequently, the elevating pins 42a are raised from the substrate mounting table 41, so that the substrate W is transferred onto the elevating pins 42a from the substrate holder 56. When the substrate W1 is completely transferred to the elevating pins 42a, the substrate holder 56 and 57 are moved back from the inside of the processing chamber 40 to the load lock chamber 20 and moved up to the standby positions C and D. At the same time, the elevating pins 42a are lowered, and, thus, the substrate W1 supported by the elevating pins 42a are mounted onto the substrate mounting table 41. If the substrate W is detected to be mounted on the substrate mounting table 41 by the controller 4, the substrate mounting table 41 is rotated clockwise again at the preset angle α (see FIG. 9).

Figure 10:
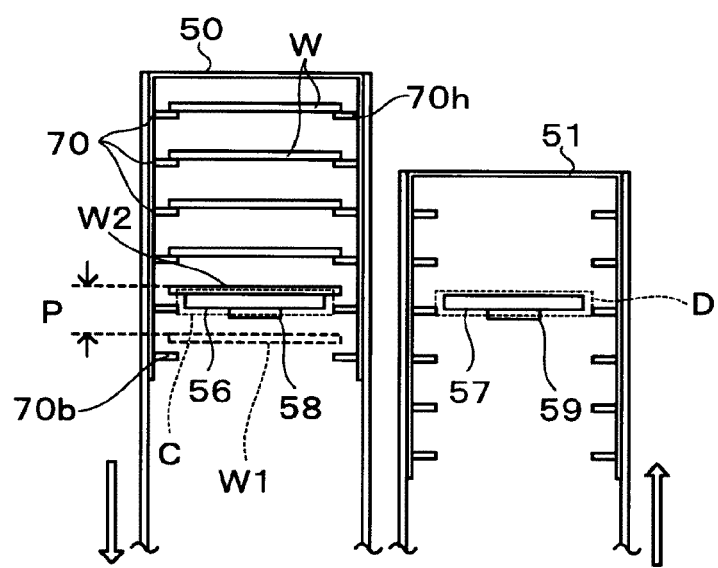
FIG. 10 is a diagram showing a state where a substrate is transferred onto the substrate holder.

Then, while the substrate holders 56 and 57 are on standby at the standby positions C and D, the substrate accommodation units 50 and 51 are lowered and raised again, respectively, by the distance P so as to transfer a second substrate W2 to the substrate holder 56 (see FIG. 10). Subsequently, the substrate W2 is introduced into the processing chamber 40 again by the transfer mechanism 52. At this time, the substrate mounting table 41 has been rotated clockwise at the predetermined angle α, so that the substrate W2 can be mounted on a position where the substrate W1 was mounted as indicated by a dashed line in FIG. 9. Accordingly, the substrate W2 is transferred to the elevating pins 42a at the transfer position A and mounted on the substrate mounting table 41. By repeating this operation on a substrate W3 to W6 in sequence, all the substrates W1 to W6 in the substrate accommodation unit 50 are loaded into the processing chamber 40.

When all the substrates W are loaded into the processing chamber 40, the gate valve 28 is closed. Then, the processing of the substrates W is performed by the controller 4, so that a film forming process is performed on each of the substrates W1 to W6. Further, while the processing of the substrates W is being performed in the processing apparatus 22, the empty substrate accommodation unit 51 is lifted up to the raised position by the controller 4, and new unprocessed substrates W1 to W6 are accommodated therein by the arm 15. At this time, the substrate accommodation unit 50, which is located at the lowered position in the empty state after the transfer of all the substrates W1 to W6 is completed, remains thereat.

When the film forming process is completed in the processing apparatus 22, the gate valve 28 is opened. Then, a processed substrate Wa is unloaded from the processing chamber 40 by the substrate holder 56 of the transfer mechanism 52 and accommodated in the substrate accommodation unit 50, whereas the unprocessed substrate W is loaded into the processing chamber 40 from the substrate accommodation unit 51. In this manner, the substrates W are replaced with each other.

Figure 11:
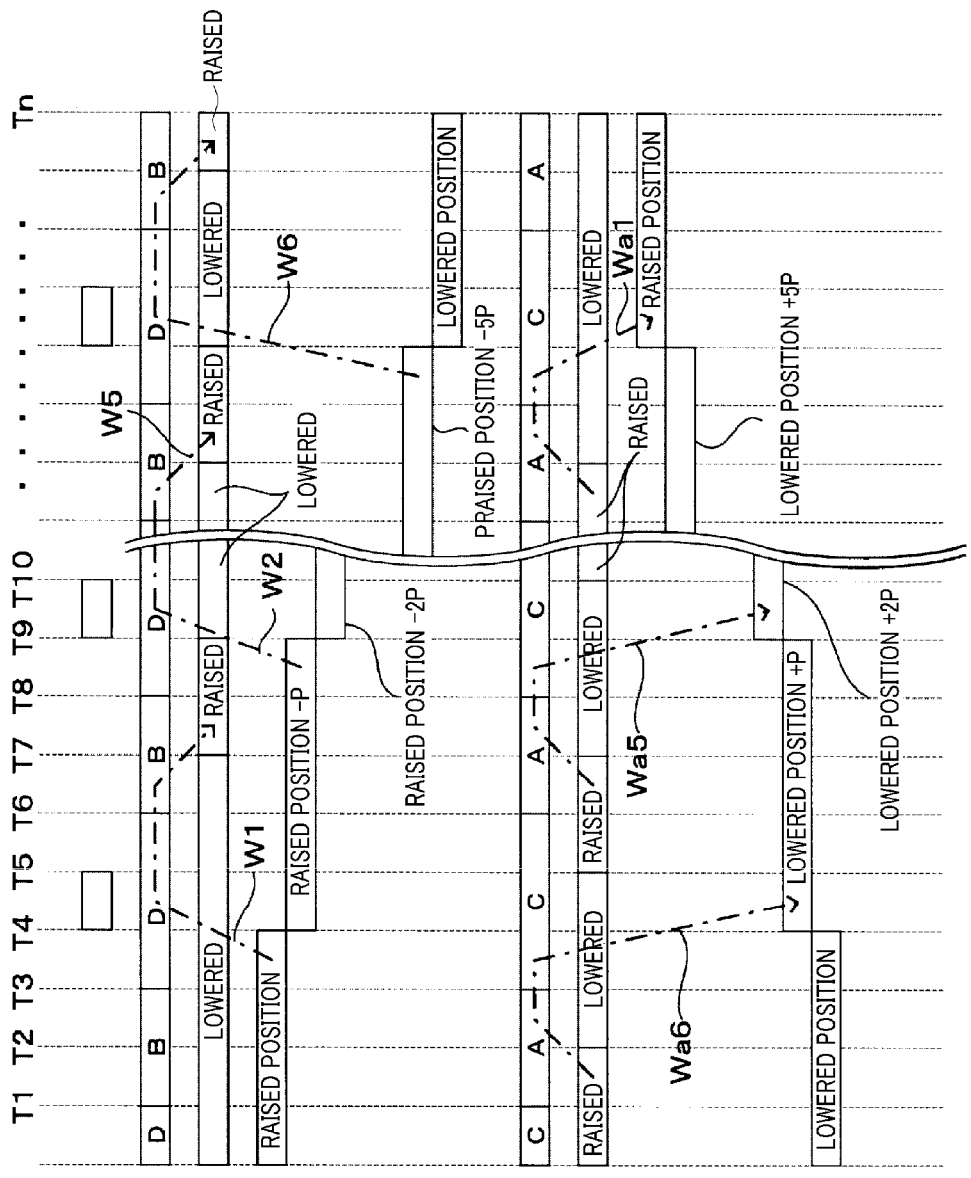
FIG. 11 presents a time chart for a replacement of substrates.

There will be explained the replacement between the substrate Wa and the substrate W. FIG. 11 is a time chart showing the replacement between the substrate W and the substrate Wa. In FIG. 11, A to D show that the substrate holders 56 and 57 are positioned at the transfer positions A and B or the standby positions C and D, and a dashed dotted arrow shows where the substrates W and Wa are positioned. A section of each of the substrate accommodation units 50 and 51 illustrates a change in the height direction when the substrate accommodation units 50 and 51 are lowered and raised from the raised position and the lowered position, respectively, by the distance P. To elaborate, when the substrate accommodation unit 51 is lowered by the distance P from the raised position, its position is indicated on the time chart as a raised position (−P).

Figure 12:
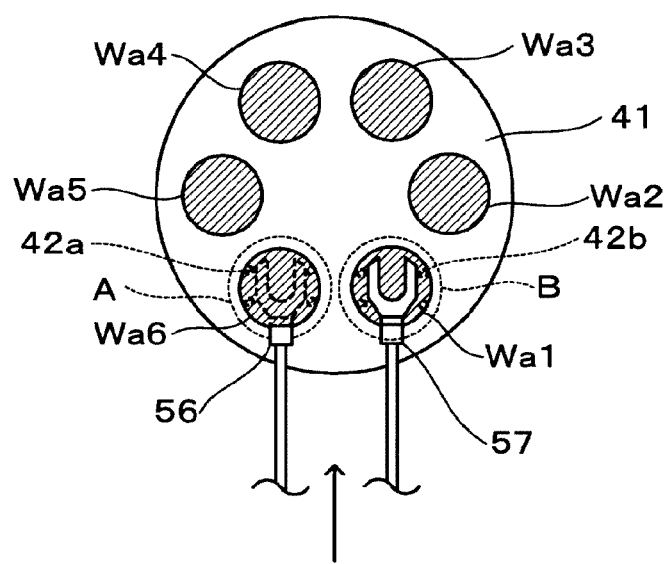
FIG. 12 is a diagram showing a state where the substrate is transferred from elevating pins onto the substrate holder.
Figure 13:
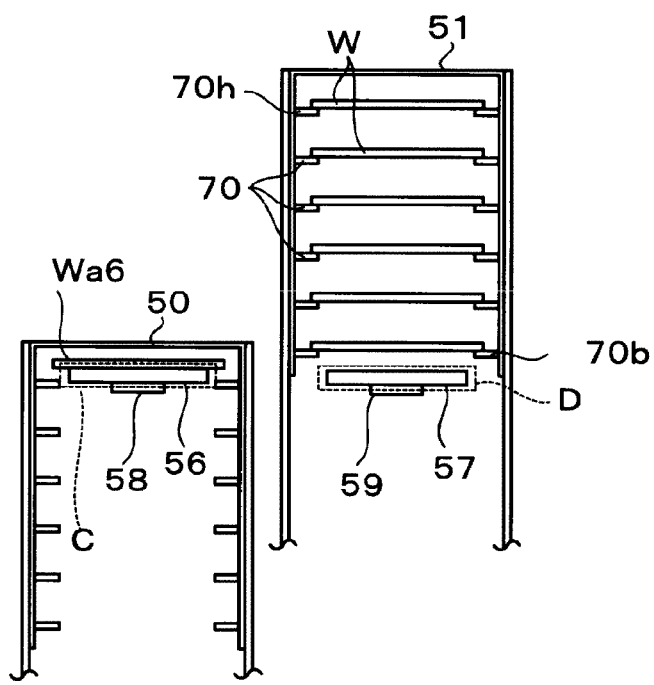
FIG. 13 is a diagram showing states where the substrate accommodation unit is located at a raised position and a lowered position, respectively.
Figure 14:
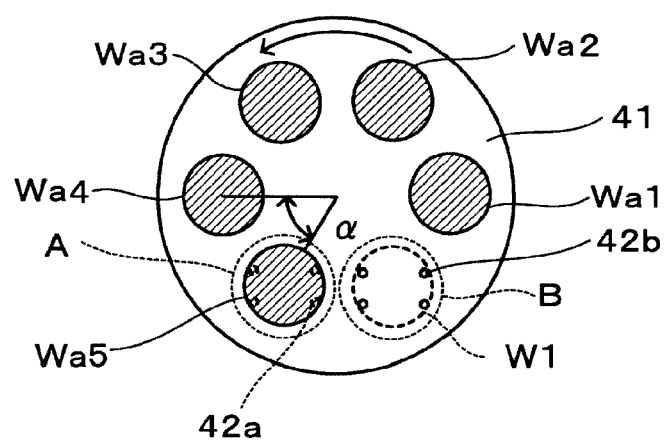
FIG. 14 is a diagram showing a state where a substrate is transferred between the substrate accommodation unit and the substrate holder.
Figure 15:
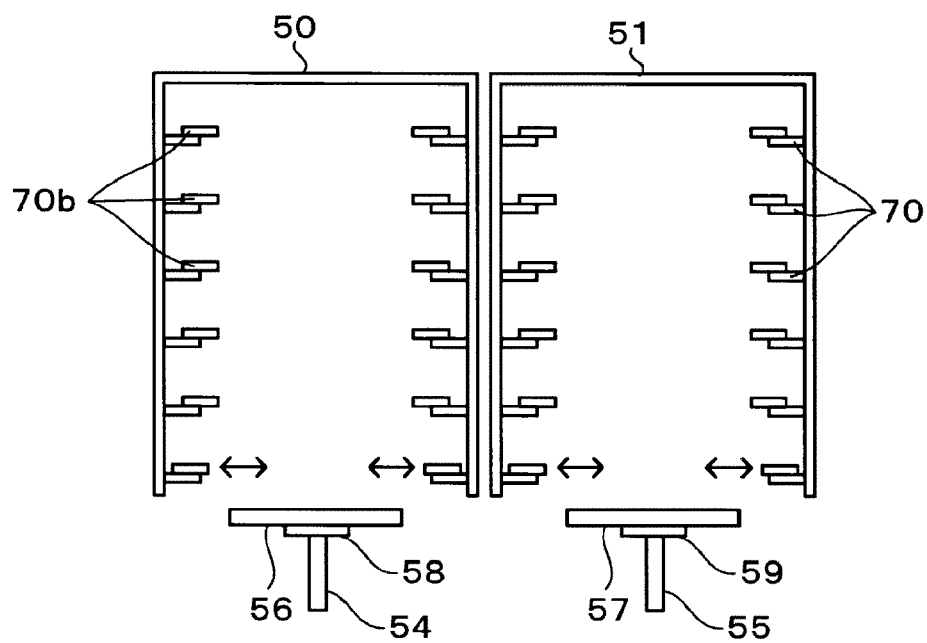
FIG. 15 is a diagram showing a state where the substrate mounting table is rotated at a preset angle after the substrate is unloaded.
Figure 18:
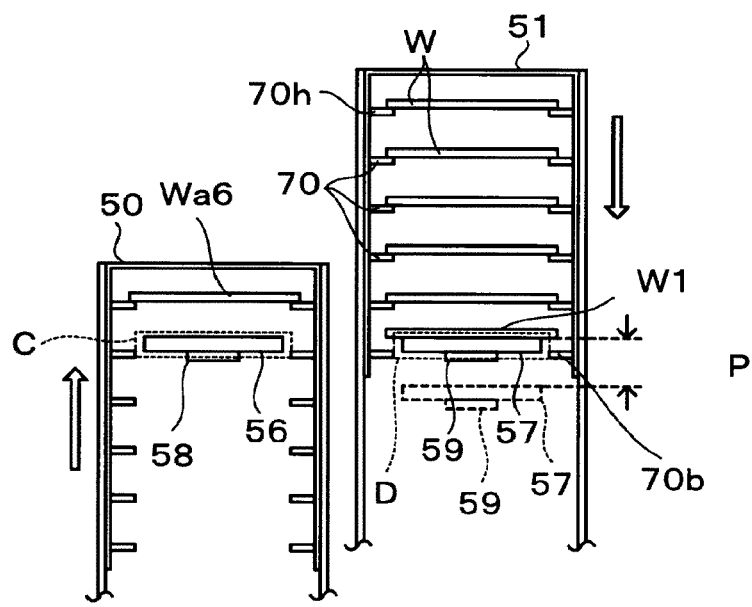
FIG. 18 is a diagram showing a schematic configuration of the substrate accommodation unit having a support moving mechanism.

A substrate Wa6 on which a film forming process has been performed in the processing chamber 40 is raised to the transfer position A by the elevating pins 42a (see T1 in FIG. 11). Subsequently, the substrate holders 56 and 57 of the transfer mechanisms 52 and 53 move to the transfer positions A and B (see T2 in FIG. 11) and, as they are, the elevating pins 42a are lowered, whereby the substrate Wa6 is transferred from the elevating pins 42a to the substrate holder 56 (see T3 in FIG. 11 and FIG. 12). Thereafter, the substrate holders 56 and 57 of the transfer mechanisms 52 and 53 are moved back to the load lock chamber 20 from the inside of the processing chamber 40 and moved to the standby positions C and D (see T4 in FIG. 11). At this time, as for the vertical position of the substrate accommodation unit 50, it is located at the lowered position after the transfer of the unprocessed substrates W into the processing chamber 40 is completed as described above (see FIG. 13). Then, the substrate accommodation unit 50 is raised by the distance P, whereas the substrate accommodation unit 51 is lowered by the same distance, i.e., the distance P in a reverse direction of the substrate accommodation unit 50. Accordingly, the substrate Wa6 is transferred from the substrate holder 56 to the substrate accommodation unit 50, and at the same time, the substrate W is transferred from the substrate accommodation unit 51 to the substrate holder 57 (see T5 in FIG. 11 and FIG. 14). Although it is illustrated in FIGS. 10 and 18 that the substrate holder 56 and 57 is raised up from a position indicated by a dashed line to a position indicated by a solid line, respectively, this just shows a change in a relative position between the substrate accommodation units 50 and 51 and the substrate holders 56 and 57 in a height direction for convenience of illustration. It is not the substrate holders 56 and 57 but the substrate accommodation units 50 and 51 that actually moves.

Further, the substrate Wa6 is unloaded from the processing chamber 40, and the substrate mounting table 41 is rotated at the preset angle α in the reverse direction to the rotation direction before the processing of the substrate W is performed, i.e., in counterclockwise direction. Accordingly, a new unprocessed substrate W1 can be mounted on a position of the substrate mounting table 41 below the transfer position B (see FIG. 14). Then, after a rotation of the substrate mounting table 41 is finished, the substrate Wa5 is on standby with a support by the elevating pins 42a (see T6 in FIG. 11). Thereafter, the substrate holder 57 which holds the unprocessed substrate W1 and the substrate holder 56 which does not hold the substrate are introduced into the processing chamber 40 (see T7 in FIG. 11). Subsequently, the processed substrate Wa5 is transferred from the transfer position A to the substrate holder 56 by lowering the elevating pins 42a, whereas the substrate W is transferred from the transfer position B to the elevating pins 42b by raising the elevating pins 42b (see T8 in FIG. 11). Then, the substrate holders 56 and 57 are moved back to the load lock chamber 20 and moved to the standby positions C and D (see T9 in FIG. 11). Thereafter, the substrate accommodation units 50 and 51 are lowered and raised, respectively, so that the substrate W2 is transferred from the substrate accommodation unit 51 to the substrate holder 57 and the substrate Wa5 is transferred from the substrate holder 56 to the substrate accommodation unit 50 (see T10 in FIG. 11). Accordingly, between T8 and T10 in FIG. 11, for example, the substrate Wa5 is transferred from the substrate holder 56 to the substrate accommodation unit 50 and at the same time, the substrate W2 is transferred from the substrate accommodation unit 51 to the substrate holder 57. Further, at the same time, the substrate mounting table 41 is rotated counterclockwise at the predetermined angle α, and these operations are performed until Tn in FIG. 11 when all the substrates W and Wa are completely replaced. Thereafter, the film forming process is performed again when all the substrates within the processing chamber 40 are replaced with unprocessed substrates W. In this way, the processed substrates Wa1 to Wa6 are accommodated in the substrate accommodation unit 50 in the same order as the unprocessed substrates W1 to W6 are accommodated therein. Thereafter, the film forming process is performed again when all the substrates W within the processing chamber 40 are replaced with the unprocessed substrates.

During the film forming process, the processed substrates Wa accommodated in the substrate accommodation unit 50 are returned back into the cassette C via the arm 15, and new unprocessed substrates W are then accommodated in the substrate accommodation unit 50 by the arm 15. After the completion of the film forming process, while the substrate mounting table 41 is being rotated backward, i.e., in the clockwise direction, the processed substrates Wa are sequentially accommodated in the substrate accommodation unit once used to store the unprocessed substrates W loaded into the processing chamber, i.e., in the substrate accommodation unit 51 in the same order as that in case of substrate accommodation unit 50. Concurrently, the unprocessed substrates W within the substrate accommodation unit 50 are loaded into the processing chamber 40 in sequence, and the above-described series of processes are repeated. Further, since the process performed in the processing apparatus 23 is the same as that performed in the processing apparatus 22, description thereof will be omitted here.

In accordance with the above-discussed embodiment of the present disclosure, the substrate mounting table 41, which mounts the plurality of substrates W on the concentric circle, is configured to be rotatable forward and backward. Accordingly, after the processing of the substrates W is performed in the processing chamber 40, it is possible to unload the processed substrates Wa from the processing chamber 40 by, e.g., the substrate holder 56, which is used to load the unprocessed substrates W into the processing chamber, while rotating the substrate mounting table in the reverse direction as it is rotated when the unprocessed substrates W are loaded into the processing chamber. In this way, the processed substrates Wa can be accommodated in the substrate accommodation unit 50 in sequence starting from, e.g., the lastly loaded substrate Wa6. Therefore, by accommodating the processed substrates Wa in sequence from the lastly loaded substrate W in, e.g., the substrate accommodation unit 50, which is in standby mode after the loading of the unprocessed substrates W into the processing chamber 40 is completed, the transfer of the substrates can be carried out between the processing apparatus 22 and the substrate accommodation unit 50 in a shorter period of time as compared to conventional case, while maintaining the original order of the processed substrates Wa to be accommodated in the substrate accommodation unit 50.

Furthermore, the supports 70 of the substrate accommodation units 50 and 51 are provided at positions where they are not overlapped with the substrate holders 56 and 57 when viewed from the top and the substrate accommodation units 50 and 51 are configured to be elevated by the elevating mechanisms 54 and 55. Thus, if the substrate accommodation units 50 and 51 move by the distance P in a vertical direction which is an interval between the supports 70 when the substrate holders 56 and 57 have been introduced into the substrate accommodation units 50 and 51, i.e., on standby positions C and D, the substrates W and Wa can be transferred from/to the supports 70 while the substrate holders 56 and 57 and the supports 70 passed each other. Therefore, in case, for example, the substrate W is transferred to the upper end support 70h of the substrate accommodation unit 50, there is no need to vertically move through a distance Q in a height direction of the substrate accommodation unit 50, for example, as a conventional transfer arm. Accordingly, by reducing a time for replacing the substrates W and Wa between the processing apparatus 22 and the substrate accommodation units 50 and 51, throughput of the substrate processing system 1 can be further improved.

In the above embodiment, the elevating mechanisms 54 and 55 are installed with respect to the substrate accommodation units 50 and 51, respectively. However, one elevating mechanism, for example, may be installed with respect to the substrate accommodation units 50 and 51 and a gear, for example, serving as a driving force transmission mechanism for dividing and transmitting a driving force of the elevating mechanism may be installed. Further, the substrate accommodation unit 50 and the substrate accommodation unit 51 may be configured to move in a reverse direction to each other at the same time in a vertical direction. Accordingly, there is no need to install the independent elevating mechanisms 54 and 55 for the substrate accommodation units 50 and 51, so that it is possible to compactly design the substrate transfer apparatus 24.

Figure 16:
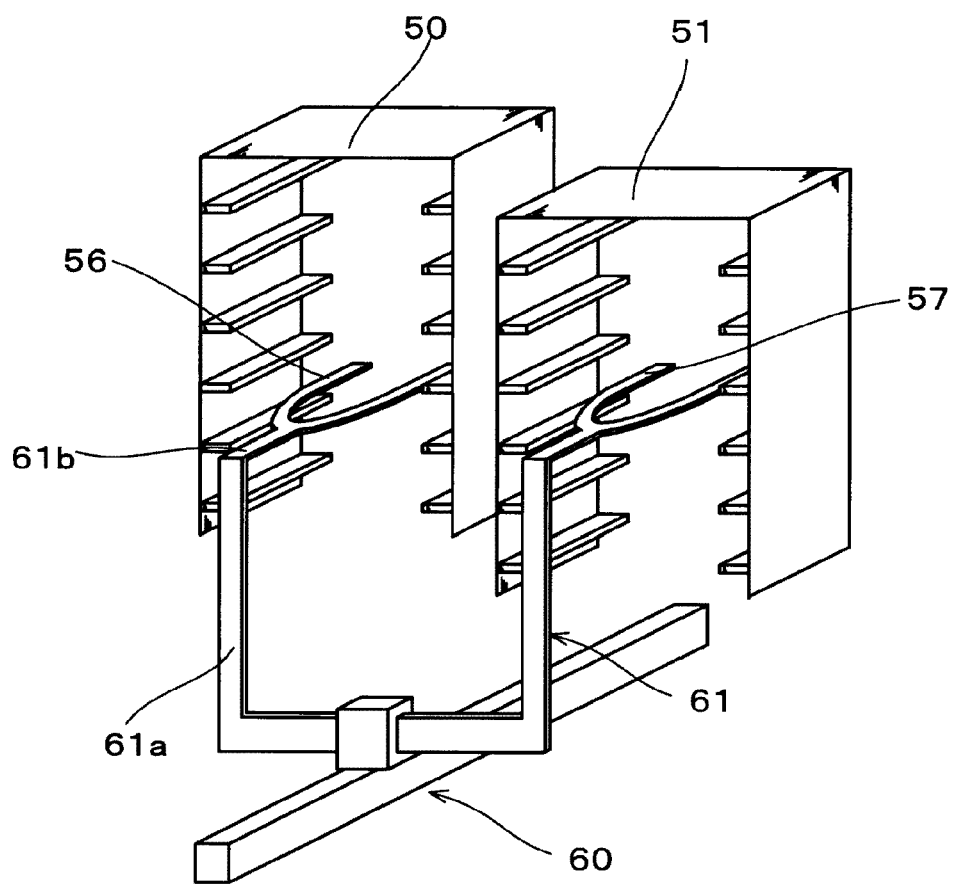
FIG. 16 is a diagram showing the substrate holder having a connecting member.

Instead of the moving mechanisms 58 and 59 installed with respect to the substrate holders 56 and 57, respectively, one moving mechanism 60 may be installed with respect to the substrate holders 56 and 57 as illustrated in FIG. 16. The substrate holder 56 and the substrate holder 57 may be joined to, e.g., a connecting member 61 which is formed in a substantial U shape having a downwardly protruding curve at the moving mechanism 60. In this case, there is no need to install the independent moving mechanisms 58 and 59 for the substrate holders 56 and 57, so that it is possible to compactly design the substrate transfer apparatus 24. In FIG. 16, the reason why the connecting member 61 has the substantial U shape having a downwardly protruding curve is to install a vertical portion 61a at the connecting member 61 such that the connecting member 61 do not interfere with the substrate accommodation units 50 and 51 when the substrate holders 56 and 57 move. Therefore, a shape of the connecting member 61 is not limited to the shape shown in FIG. 16 as long as it does not interfere with the substrate accommodation units 50 and 51. Further, a horizontal portion 61b of the connecting member 61 has a length which does not cause the vertical portion 61a of the connecting member 61 to interfere with the opening 26 of the load lock chamber 20 when the substrate holders 56 and 57 move to the transfer positions A and B in the processing chamber 40.

Figure 17:
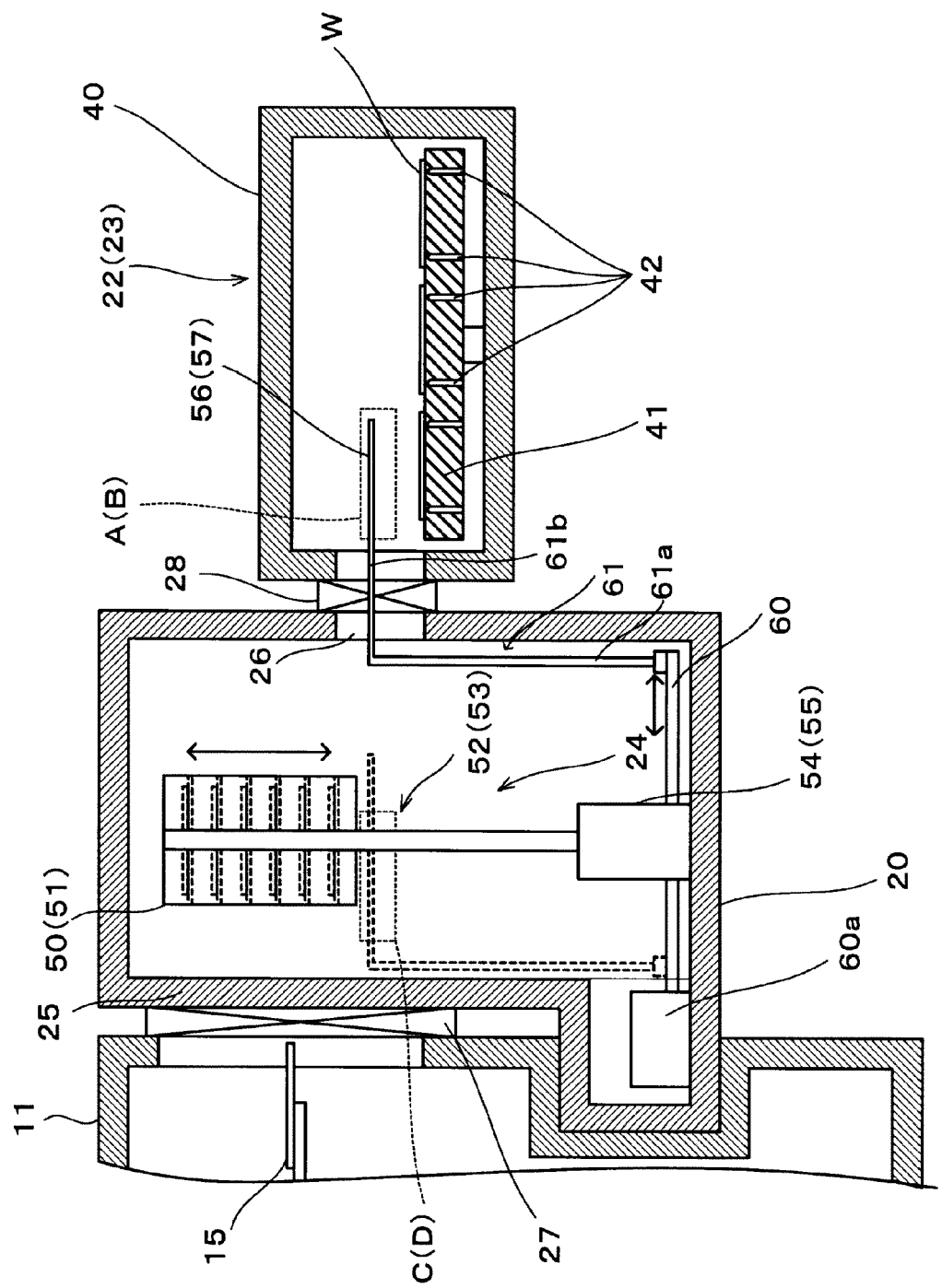
FIG. 17 is a longitudinal cross-sectional view showing a schematic configuration of a substrate transfer apparatus and a processing apparatus in accordance with another embodiment of the present disclosure.

In case of using the connecting member 61, a driving unit 60a of the moving mechanism 60 is positioned below the opening 25 of the load lock chamber 20. Accordingly, in this case, if the driving unit 60a, for example, is positioned at a space which protrudes toward the transfer chamber 11 and is located below the opening 25 of the load lock chamber 20 at the side of the transfer chamber 11 as illustrated in, e.g., FIG. 17, it is possible to arrange the moving mechanism 60 without changing a size of the load lock chamber 20.

Figure 19:
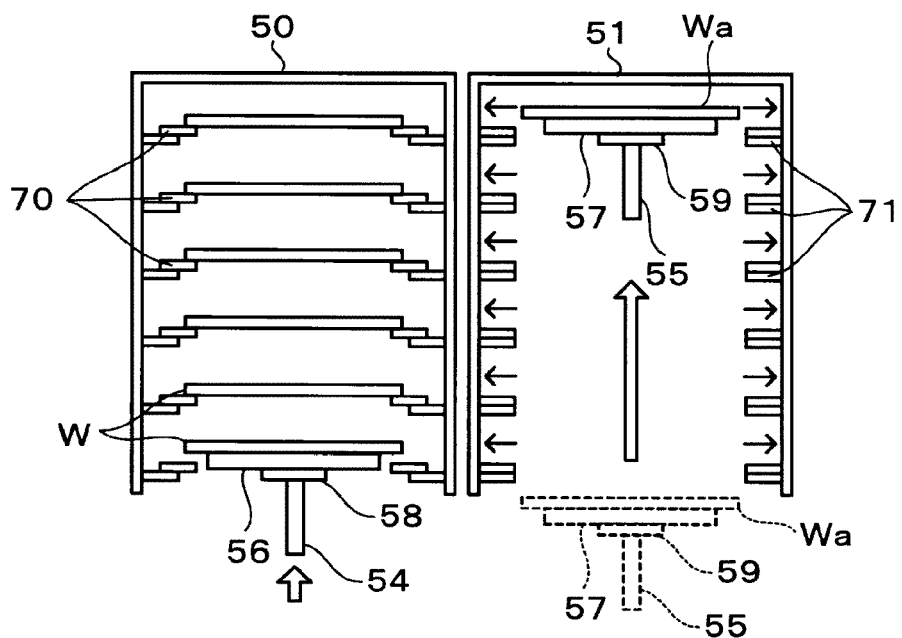
FIG. 19 is a diagram showing a state where the substrate holder is raised up to a preset substrate height.
Figure 20:
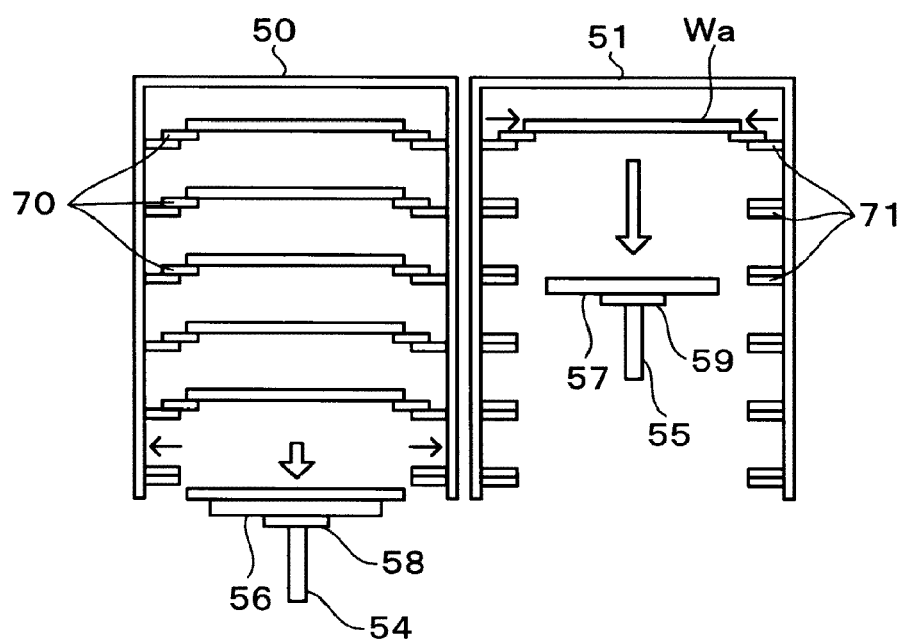
FIG. 20 is a diagram showing a state where the substrate is transferred between the substrate accommodation unit and the substrate holder.

In the above-described embodiment, the substrate accommodation units 50 and 51 are elevated by the elevating mechanisms 54 and 55, respectively. However, as illustrated in, e.g., FIG. 18, it may be possible to install a support moving mechanism 71 that moves the supports 70 of the substrate accommodation units 50 and 51 between an inner side and an outer side of the substrates W and Wa, i.e., in the X-axis direction of FIG. 1 and the substrate holders 56 and 57 may be elevated by the elevating mechanisms 54 and 55. For example, when the substrate W and the substrate Wa are transferred to the substrate accommodation units 50 and 51, respectively, by the substrate transfer apparatus 24 configured as stated above, the substrate holders 56 and 57 are moved to the standby positions C and D, respectively while the substrate Wa is held by, e.g., the substrate holder 57. Subsequently, as illustrated in, e.g., FIG. 19, the substrate holder 57 is raised up to a predetermined height while the supports 70 are moved back by the support moving mechanism 71 to a position where the supports 70 are not overlapped with the substrate Wa when viewed from the top. At the same time, by raising the substrate holder 56 to a predetermined height, the substrate W is transferred from the supports 70 to the substrate holder 56. Further, as illustrated in, e.g., FIG. 18, when the substrate holder 56 is raised, it does not hold the substrate W. Accordingly, since the substrate W does not interfere with the supports 70, there is no need to move back the supports 70 of the substrate accommodation unit 50 at this time. After the substrate holders 56 and 57 are raised to the predetermined heights, the supports 70 in the substrate accommodation unit 50 is moved back to a position where the supports 70 does not interfere with the substrate W, and then the substrate holder 56 is lowered. In the substrate accommodation unit 51, the supports 70 are returned to a position where it was before being moved back, and then the substrate holder 57 is lowered so as to transfer the substrate Wa to the supports (see FIG. 20). Accordingly, the substrate holder 57 is raised via a space between the supports 70 while holding the substrate Wa and then performs the transfer of the substrate Wa. In this case, there is no need for the transfer arm to perform a revolving operation which has been made by a conventional transfer arm between the substrate accommodation units 50 and 51 serving as buffer areas and the processing chamber 40 when a substrate is transferred. Therefore, it is possible to reduce a time for replacing the substrates W and Wa between the processing apparatus 22 and the substrate accommodation units 50 and 51. Accordingly, throughput of the substrate processing system 1 can be improved.

Figure 21:
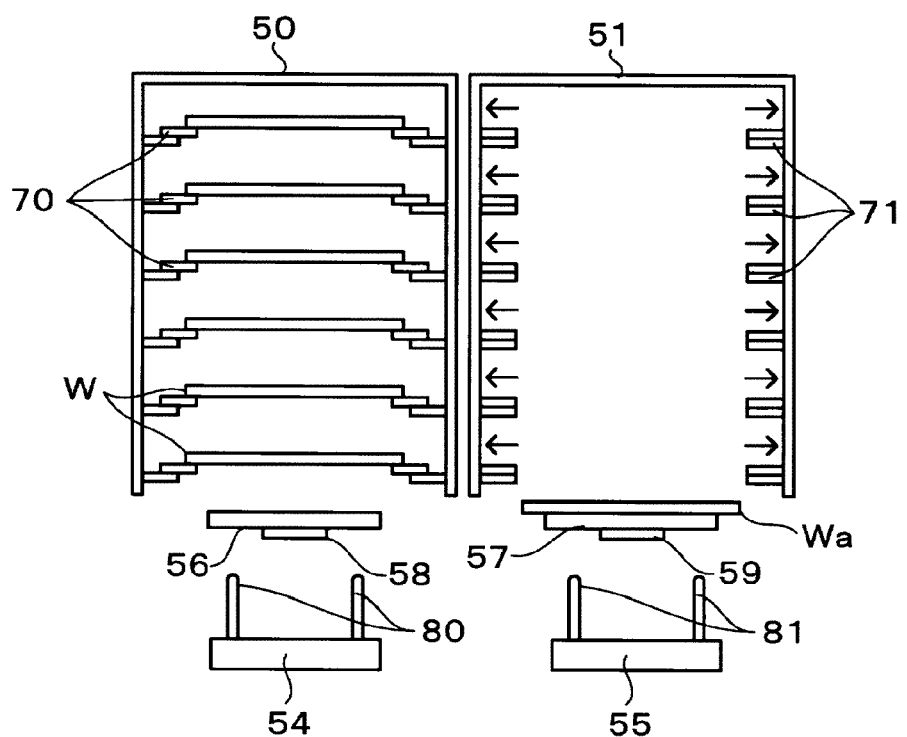
FIG. 21 is a diagram showing a schematic configuration of the substrate accommodation unit having supporting pins below the substrate accommodation unit.
Figure 22:
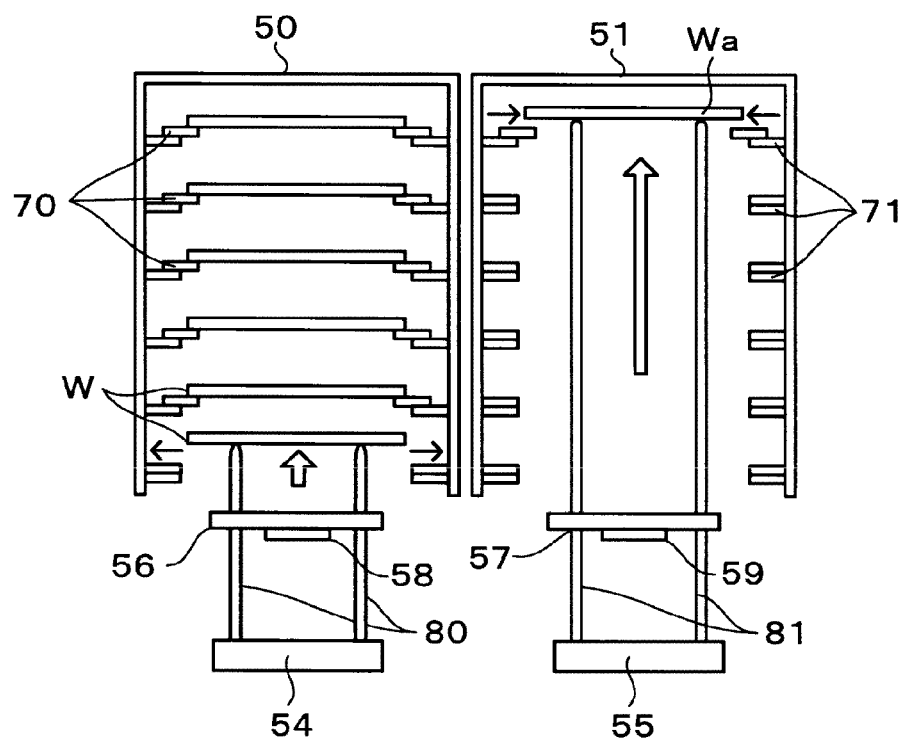
FIG. 22 presents a diagram showing a state where the substrate is supported by the supporting pins after the supports is retreated.

In addition to the above-described method of moving the substrate accommodation units 50 and 51 up and down as well as elevating the substrate holders 56 and 57 after the supports 70 move back, for example, the substrates W and Wa can be transferred between the substrate accommodation units 50 and 51 and the substrate holders 56 and 57 by installing supporting pins 80 and 81, serving as another supporting units for supporting the substrates W and Wa, below the substrate accommodation units 50 and 51 and elevating the supporting pins 80 by the elevating mechanisms 54 and 55 as illustrated in FIG. 21. To be specific, the supporting pins 80 and 81 are installed at a position, where the supporting pins 80 and 81 do not interfere with the substrate holders 56 and 57 when the substrate holders 56 and 57 move from the standby positions C and D toward the processing apparatus 22, below the substrate accommodation units 50 and 51 including the support moving mechanism 71 that moves back the supports to a position, e.g., where the supports 70 do not interfere with the substrates W and Wa. Further, for example, the substrate holder 56 is moved to the standby position C while it does not hold the substrate W, and then the supporting pins 80 are raised so as to support the substrate W. At the same time, the substrate holder 57 is moved to the standby position D while it holds the substrate Wa, and then the supporting pins 81 are raised so as to support the substrate Wa (see FIG. 22). Subsequently, when the supports 70 are moved back in the substrate accommodation unit 50 and then the supporting pins 80 are lowered, the substrate W is transferred between the supporting pins 80 and the substrate accommodation unit 50. In the substrate accommodation unit 51, the supports 70 are returned to a position where it was before being moved back, and then the supporting pins 81 are lowered, and thus, the substrate Wa is transferred between the supporting pins 81 and the supports 70. At this time, the supporting pins 80 and 81 are installed at positions where the supporting pins 80 and 81 do not interfere with the substrate holders 56 and 57 when the substrate holders 56 and 57 are moved from the standby positions C and D toward the processing apparatus 22. Therefore, if when the substrate W is transferred from the substrate accommodation unit 50 to the substrate holder 56, for example, the substrate W is supported in advance by the supporting pins 80 at a position higher than the standby position C by P/2, the substrate W can be transferred between the substrate accommodation unit 50 and the substrate holder 56 by the minimum operation, i.e., by lowering the supporting pins by a half of the distance P after the substrate holder 56 is moved to the standby position C. Therefore, a time for replacing the substrates W and Wa between the processing apparatus 22 and the substrate accommodation units 50 and 51 can be reduced and throughput of the substrate processing system 1 can be improved.

Figure 23:
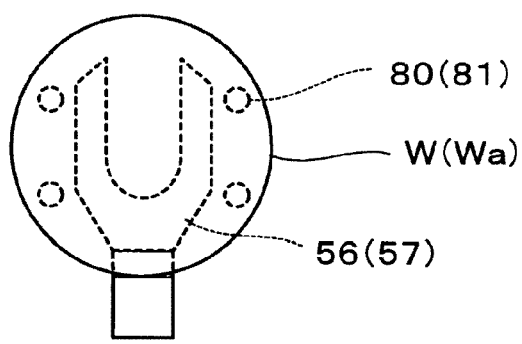
FIG. 23 is a diagram showing a positional relationship between the substrate holder and the elevating pins.
Figure 24:
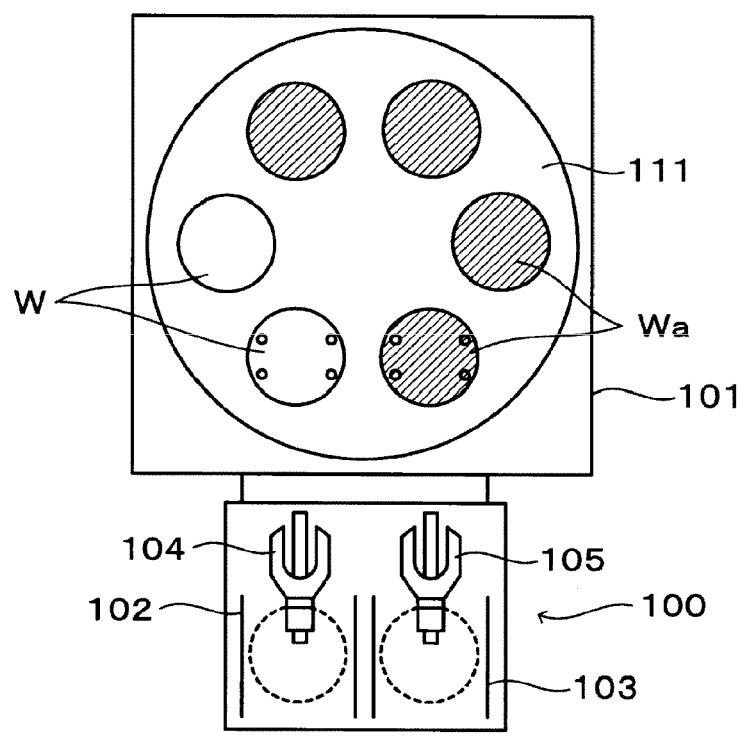
FIG. 24 is a plane view showing schematic configurations of the substrate transfer apparatus and a substrate processing apparatus.
Figure 25:
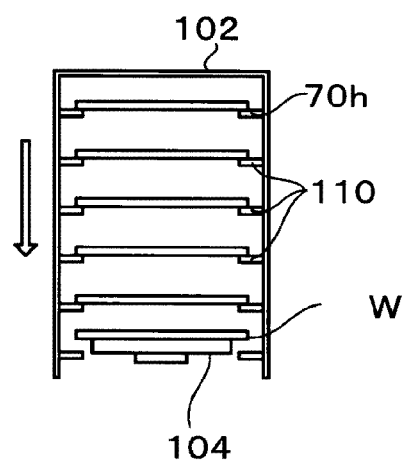
FIG. 25 is a side view showing a schematic configuration of the substrate accommodation unit.
Figure 26:
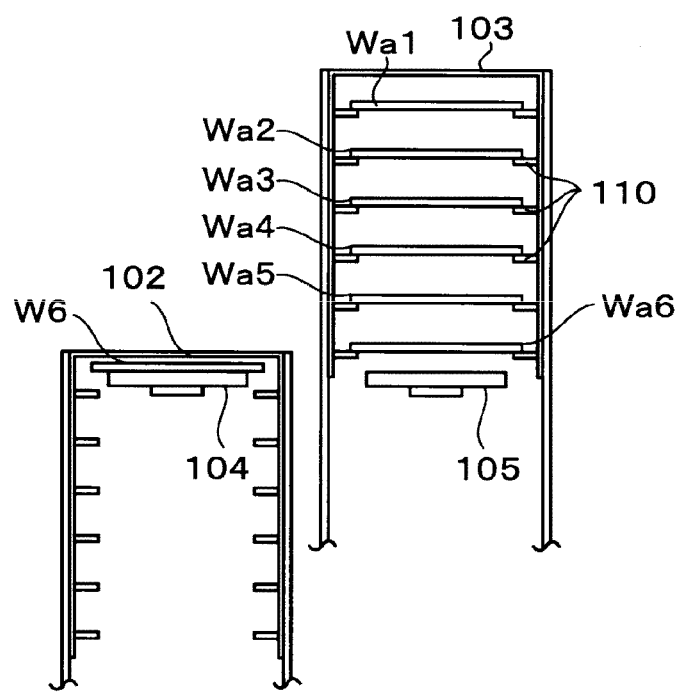
FIG. 26 is a diagram showing an arrangement order of substrates in the substrate accommodation unit.

By way of example, the supporting pins 80 may be arranged to surround the substrate holders 56 and 57 as illustrated in FIG. 23 in order not to interfere with the substrate holders 56 and 57 when the substrate holders 56 and 57 are moved from the standby positions C and D toward the processing apparatus 22.

In the above-described embodiment, although the transfer mechanisms 52 and 53 are slid by the moving mechanisms 58 and 59 in a horizontal direction, the moving mechanism may have an expandable and contractible arm in the same manner as the substrate transfer device 14, for example.

Furthermore, in the above-described embodiment, although the substrate is transferred between the cassette C of the cassette station 2 and the substrate accommodation units 50 and 51 by the one substrate transfer device 14 with the arm 15 having the plurality of substrate holders 16 arranged in the multi stages, it may be also possible to install a plurality of arms (not shown) having, e.g., one substrate holder 16 or to install a plurality of substrate transfer devices 14 as long as the replacement of the substrates W and Wa can be carried out in the substrate accommodation unit 50 and 51 without loss.

The above-described embodiment is provided for the purpose of illustration with reference to the accompanying drawings but the present invention is not limited thereto. It would be understood by those skilled in the art that various changes and modifications may be made without changing technical conception and essential features of the present invention and all modifications and embodiments are included in the scope of the present invention. The present invention is not limited to the above-described embodiment and can be varied in many ways. The present disclosure can be applied to a case where a substrate is other than a wafer, such as a flat panel display (FPD), a mask reticle for a photo mask or the like. Further, the present disclosure can be applied to a case where a process performed in a processing apparatus is other than a CVD process, such as a plasma process, e.g., an etching process, or the like. Furthermore, the present disclosure is not limited to the shape of the transfer arm described in the present embodiment and thus can be applied to other various shapes of transfer arms.

INDUSTRIAL APPLICABILITY

The present disclosure is useful in transferring a substrate with respect to a processing apparatus for performing a predetermined process on the substrate.

What is claimed is:

1. A substrate processing system comprising:
a processing chamber that performs a preset process on a plurality of substrates in a batch-type manner;
a substrate mounting table, installed within the processing chamber, configured to mount the plurality of substrates on a single circle and to be rotatable with respect to a central axis of the substrate mounting table in a clockwise direction and a counterclockwise direction;
a cassette station including a cassette mounting unit and a transfer chamber arranged adjacent to the cassette mounting unit;
a load lock chamber installed between the processing chamber and the transfer chamber;
a first substrate accommodation unit configured to accommodate the plurality of substrates in multi-stages in a vertical direction;
a second substrate accommodation unit configured to accommodate the plurality of substrates in multi-stages in a vertical direction;
a first substrate holder configured to hold the substrate transferred between the first substrate accommodation unit and the processing chamber;
a second substrate holder configured to hold the substrate transferred between the second substrate accommodation unit and the processing chamber;
a first elevating mechanism configured to move at least one of the first substrate accommodation unit and the first substrate holder up and down relative to each other in order to transfer the substrate between the first substrate accommodation unit and the first substrate holder;

a second elevating mechanism configured to move at least one of the second substrate accommodation unit and the second substrate holder up and down relative to each other in order to transfer the substrate between the second substrate accommodation unit and the second substrate holder; and a controller configured to control a rotation of the substrate mounting table, an up/down movement of the first and second elevating mechanisms and the transfer of the substrates by the first and second substrate holders, wherein the first and second substrate accommodation units, the first and second substrate holders, and the first and second elevating mechanisms are installed within the load lock chamber, wherein the first substrate accommodation unit accommodating unprocessed substrates is lowered relative to the first substrate holder in order to transfer the unprocessed substrates from the first substrate accommodation unit to the first substrate holder, and the first substrate holder loads the unprocessed substrates into the processing chamber in sequence while sequentially rotating the substrate mounting table at a preset angle in one direction, wherein the processing chamber performs the preset process on the plurality of substrates and, wherein the first substrate holder unloads processed substrates from the processing chamber after the completion of the preset process; the first substrate accommodation unit is raised relative to the first substrate holder in order to transfer the processed substrates into the first substrate accommodation unit from the first substrate holder; the second substrate accommodation unit for accommodating unprocessed substrates is lowered relative to the second substrate holder in order to transfer the unprocessed substrates from the second substrate accommodation unit onto the second substrate holder; and, the second substrate holder loads the unprocessed substrate into the processing chamber in sequence while sequentially rotating the substrate mounting table at the preset angle in another direction.

2. The substrate processing system of claim 1, further comprising:

a substrate accommodation vessel mounted at the cassette mounting unit; and a substrate transfer device, installed within the transfer chamber, configured to transfer the substrates between the substrate accommodation vessel and the first and second substrate accommodation units, wherein the substrate transfer device includes substrate holding members in multi-stages in a vertical direction so as to hold the substrates.

3. The substrate processing system of claim 1, wherein, in the first substrate accommodation unit, a support configured to support the substrate is provided at a position where the support is not overlapped with the first substrate holder when viewed from the top, and in the second substrate accommodation unit, a support configured to support the substrate is installed at a position where the support is not overlapped with the second substrate holder when viewed from the top.

4. The substrate processing system of claim 3, wherein the first elevating mechanism moves the first substrate accommodation unit up and down, and the second elevating mechanism moves the second substrate accommodation unit up and down.

5. The substrate processing system of claim 3, wherein the first substrate accommodation unit includes a first support moving mechanism that moves the support between inside and outside of the substrate, the second substrate accommodation unit includes a second support moving mechanism that moves the support between the inside and the outside of the substrate, the first elevating mechanism moves the first substrate holder up and down, and the second elevating mechanism moves the second substrate holder up and down.

6. The substrate processing system of claim 3, further comprising:

a first supporting pin configured to support the substrate in the first substrate accommodation unit; and a second supporting pin configured to support the substrate in the second substrate accommodation unit, wherein the first substrate accommodation unit includes a first support moving mechanism that moves the support between inside and outside of the substrate, the second substrate accommodation unit includes a second support moving mechanism that moves the support between the inside and the outside of the substrate, the first elevating mechanism moves the first substrate holder up and down, and the second elevating mechanism moves the second substrate holder up and down.

* * * * *

UNITED STATES PATENT AND TRADEMARK OFFICE
CERTIFICATE OF CORRECTION

PATENT NO.        : 8,814,489 B2  
APPLICATION NO.   : 12/724763  
DATED             : August 26, 2014  
INVENTOR(S)       : Hiromitsu Sakaue et al.

Page 1 of 1

It is certified that error appears in the above-identified patent and that said Letters Patent is hereby corrected as shown below:

In the Specification,

Column 9, line 63, please add -- 26 -- between "opening" and "between"

Column 16, line 63, please add -- 70 -- between "supports" and "(see FIG. 20)"

Column 17, lines 25-26, please add -- 70 -- between "supports" and "to a"

Signed and Sealed this  
Twenty-fifth Day of November, 2014

Michelle K. Lee  
*Deputy Director of the United States Patent and Trademark Office*